United States Patent [19]
Gonzalez et al.

[11] Patent Number: 5,150,276
[45] Date of Patent: Sep. 22, 1992

[54] METHOD OF FABRICATING A VERTICAL PARALLEL CELL CAPACITOR HAVING A STORAGE NODE CAPACITOR PLATE COMPRISING A CENTER FIN EFFECTING ELECTRICAL COMMUNICATION BETWEEN ITSELF AND PARALLEL ANNULAR RINGS

[75] Inventors: Fernando Gonzalez; Larry D. Cromar, both of Boise, Id.

[73] Assignee: Micron Technology, Inc., Boise, Id.

[21] Appl. No.: 826,903

[22] Filed: Jan. 24, 1992

[51] Int. Cl.$^5$ .................. H01G 4/06; H01L 21/70; G11C 7/00
[52] U.S. Cl. ..................... 361/313; 437/52; 357/23.6; 365/149
[58] Field of Search ............. 361/311, 312, 313; 156/643; 357/51, 23.6; 437/47, 48, 52

[56] References Cited

U.S. PATENT DOCUMENTS

| | | | |
|---|---|---|---|
| 4,686,000 | 8/1987 | Heath | 156/643 |
| 4,849,854 | 7/1989 | Eguchi | 361/313 |
| 4,951,175 | 8/1990 | Kurosawa et al. | 361/313 |
| 5,053,351 | 10/1991 | Fazan et al. | 437/52 |
| 5,077,688 | 12/1991 | Kumanoya et al. | 365/149 |
| 5,081,559 | 1/1992 | Fazan et al. | 357/23.6 X |

FOREIGN PATENT DOCUMENTS 286270 12/1987 Japan.
74752 3/1989 Japan.

OTHER PUBLICATIONS

"3-Dimensional Stacked Capacitor Cell for 16M and 64M Drams" pp. 592-595, 1988, by T. Ema et al.

*Primary Examiner*—Donald A. Griffin
*Attorney, Agent, or Firm*—Susan B. Collier

[57] ABSTRACT

The invention is a product and method for forming same comprising a storage contact capacitor of a dynamic random access memory (DRAM) device wherein at least two annular rings and a vertical fin of silicon are fabricated in a self-aligned opening parallel to and in contact with the contact area of the substrate. The rings and fin comprise the storage node of the capacitor, and the fin is substantially centered in the rings. The fin is fabricated by forming silicon in a channel remaining after alternating layers of silicon and oxide are deposited in the opening. The final deposition of oxide is subjected to a spacer etch thereby retaining the final oxide only on sidewalls of the channel. The final oxide then functions as a masking pattern for extending the channel by subjecting the alternating layers to subsequent etches. The silicon contacts all of the silicon rings thereby providing electrical communication between the fin and the rings. Once the fin is formed the oxide is exposed, and at least portions of the oxide are etched. A dielectric layer is deposited to overlie the fins and a cell polycrystalline silicon layer is deposited to overlie the dielectric and complete the capacitor fabrication.

47 Claims, 24 Drawing Sheets

METHOD OF FABRICATING A VERTICAL PARALLEL CELL CAPACITOR HAVING A STORAGE NODE CAPACITOR PLATE COMPRISING A CENTER FIN EFFECTING ELECTRICAL COMMUNICATION BETWEEN ITSELF AND PARALLEL ANNULAR RINGS

FIELD OF THE INVENTION

This invention relates to semiconductor technology and, more particularly, to cell capacitors for use in dynamic random access memories (DRAMs).

BACKGROUND OF THE INVENTION

The memory cells of dynamic random access memories (DRAMs) which are arranged in an array having a configuration of intersecting wordlines and digit lines are comprised of two main components, a field-effect transistor (FET) and a capacitor. In DRAM cells utilizing a conventional planar capacitor, far more chip surface area is dedicated to the planar capacitor than to the field-effect transistor. In a typical construction the wordlines are generally etched from a polysilicon-1 layer. A doped region of monocrystalline silicon substrate functions as the lower capacitor plate (storage node), while a polysilicon-2 generally functions as the upper capacitor plate (cell plate).

Although planar capacitors have generally proven adequate for use in DRAM chips up to the 1-megabit level, they are considered to be unusable for more advanced DRAM generations. As component density in memory chips has increased, the shrinkage of cell capacitor size has resulted in a number of problems. Firstly, the alpha-particle component of normal background radiation can generate hole-electron pairs in the silicon substrate, which functions as the lower capacitor plate. This phenomena will cause a charge stored within the affected cell capacitor to rapidly dissipate, resulting in a "soft" error. Secondly, the sense amplifier differential signal is reduced. This aggravates noise sensitivity and makes it more difficult to design a sense amplifier having appropriate signal selectivity. Thirdly, as cell capacitor size is decreased, the cell refresh time must generally be shortened, thus requiring more frequent interruptions for refresh overhead. The difficult goal of a DRAM designer is to increase or, at least, maintain cell capacitance as cell size shrinks, without resorting to processes that reduce product yield or that markedly increase the number of masking and deposition steps in the production process.

Some manufactures of 4-megabit DRAMs are utilizing cell designs based on nonplanar capacitors. Two basic nonplanar capacitor designs are currently in use: the trench capacitor and the stacked capacitor. Both types of nonplanar capacitors typically require a greater number of masking, deposition and etching steps for their manufacture than does a planar capacitor.

In a trench capacitor, charge is stored primarily vertically, as opposed to horizontally as in the planar capacitor. Since trench capacitors are fabricated in trenches which are etched in the substrate, the typical trench capacitor, like the planar capacitor, is subject to soft errors. In addition, there are several other problems inherent in the trench design. One problem is that of trench-to-trench charge leakage, caused by the parasitic transistor effect between adjacent trenches. Another problem is the difficulty of completely cleaning the trenches during the fabrication process; failure to completely clean a trench will generally result in a defective cell.

The stacked capacitor design, on the other hand, has proven somewhat more reliable and easier to fabricate than the trench design. Since both the lower and the upper plates of a typical stacked capacitor are formed from individual polysilicon layers, the stacked capacitor is generally much less susceptible to soft errors than either the planar or trench capacitors. By placing both the wordline and the digit line beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell.

The method for forming the typical fin configuration stacked capacitor uses polycrystalline silicon/nitride layers to implement spacing of the fins. The method is complicated and employs multi-depositions and subsequent etch steps to create this stacked capacitor fin structure.

Alternatives for increasing capacitance comprise utilizing materials having larger dielectric constants, decreasing the thickness of the dielectric (decreasing the distance between the capacitor plates), or increasing capacitor surface area by texturizing the polycrystalline silicon surface.

One experimental method for increasing the capacitor surface area is the fabrication of a storage node capacitor having a double-wall crown shaped lower capacitor plate structure wherein the fabrication of the structure is initiated by etching an opening in an $SiO_2$ interlayer in order to expose a contact area of the substrate. A first polycrystalline silicon layer is then deposited to overlie the surface of the $SiO_2$ interlayer and the substrate contact area. Next $SiO_2$ is deposited in conjunction with a spacer etch to form vertical portions of $SiO_2$ adjacent to the polycrystalline silicon and forming sidewalls of the opening. A second polycrystalline silicon layer is then deposited overlying the portions of $SiO_2$ and overlying the first polycrystalline silicon layer still exposed after the $SiO_2$ deposition. The second polycrystalline silicon layer directly contacts the first polycrystalline silicon layer overlying the contact area of the substrate. The remaining portion of the opening is filled with $SiO_2$. The first and second polycrystalline silicon layers are etched to expose the $SiO_2$. Next the $SiO_2$ is etched completing the fabrication of the lower capacitor plate structure which comprises the first and second polycrystalline silicon layers remaining after the etches. Thus the lower capacitor plate comprises a two layer lower portion of polycrystalline silicon in contact with the substrate and comprises two annular rings extending vertically from the two layer portion in contact with the substrate.

SUMMARY OF THE INVENTION

The invention is a product and method for forming same comprising a storage contact capacitor of a dynamic random access memory (DRAM) device wherein at least two annular rings and a vertical fin of polycrystalline silicon are fabricated in a self-aligned opening parallel to and in contact with the contact area of the substrate. The storage contact capacitor of the invention utilizes the vertical portion of the DRAM by fabricating at least a portion of the storage node capacitor plate vertically in the DRAM. The vertical fabrication increases capacitor area while maximizing die space for a given lateral area.

The invention is an improvement of the double-wall crown shaped lower capacitor plate structure. The invention increases the area of the lower capacitor plate structure by the fabrication of at least two annular rings and a vertical fin of silicon. Alternating layers of polycrystalline silicon and oxide are deposited in an opening exposing a contact area of substrate. The opening is created by etching an oxide interlayer. The initial alternating layer contacts the exposed portion of the substrate and comprises polycrystalline silicon. A center silicon fin is formed in a channel retained and extended after the alternating depositions. The final oxide layer deposited alternatingly functions as a mask to extend the channel. The oxide mask is formed by a spacer etch wherein the oxide is retained only on the sidewalls of the channel. The alternately deposited polycrystalline silicon and oxide are alternately and insitu reative ion etched (RIE) according to the oxide mask to expose at least the initial deposition of polycrystalline silicon. The center silicon fin is formed in the extended channel to contact all previously deposited polycrystalline silicon layers above the contact area of the substrate, thereby creating a contiguous silicon structure.

The capacitor fabrication continues by exposing and then etching the oxide layers to create cavities interposed between the portions of silicon. Although an etch or planarization defines the horizontal dimension of the low capacitor plate, the height of the oxide interlayer defines the vertical dimension of the lower capacitor plate. The process is completed with a deposition of a dielectric nitride layer followed by a deposition of at least one cell polycrystalline silicon layer.

The invention allows the vertical portion of a DRAM device to be utilized as the storage cell thus maximizing die space in the horizontal direction, and reducing the stack capacitor height prior to contacts. The formation of multiple annular rings and a center fin increases the capacitor area in a given lateral area thus increasing capacitance.

Even though the capacitor can encroach the area over the wordline, the cell plate contact and the cell plate are self-aligned. The capacitor cell is compact since the buried contact size remains the same even though the contact hole is larger when encroaching the area over the wordline.

The process utilizes minimal masking steps. The process facilitates the effective use of a tungsten buried digit line configuration. The invention is conducive to fabricating the capacitor and tungsten plug in an adjacent relationship. In addition, there are no bit line stringers, thus yield is increased.

DETAILED DESCRIPTION OF THE INVENTION

The invention is the method of forming a storage node capacitor in a dynamic random access memory (DRAM). The storage node capacitor plate of the storage node capacitor has multiple parallel vertical sides formed in a deep contact opening. Since the contact height is approximately 1 micron, the transistor formation and buried bit line formation needs to be done before the tungsten plug is constructed. This facilitates the connection of the rowline and cell polycrystalline silicon to contacts at the periphery of the array. The storage node silicon is self-aligned to the rowline poly and to the buried contact pattern. The capacitor can be made taller as the need arises for a higher capacitance but the size of the horizontal component minimally effects the total capacitance.

Figure 1:
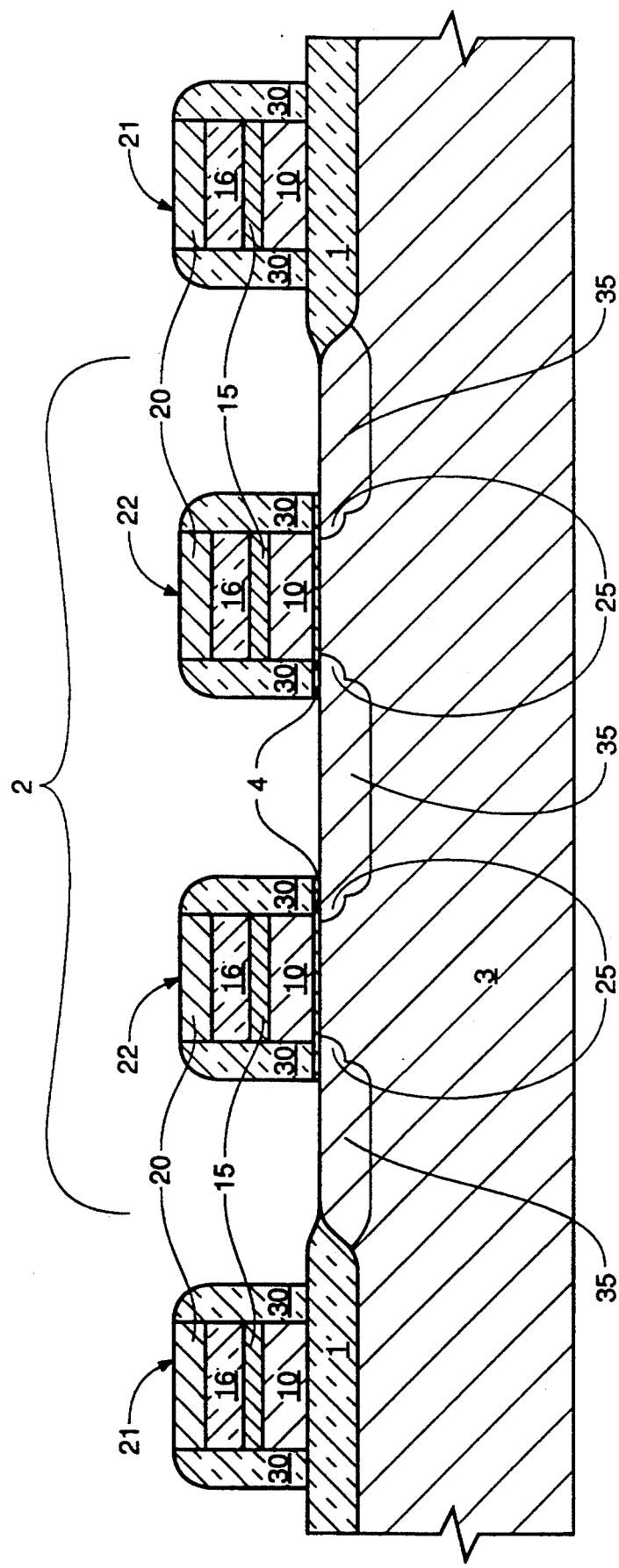
FIG. 1 is a cross-sectional view of a portion of a partially processed semiconductor wafer which depicts field-effect transistors (FETs) overlying a silicon substrate and wordlines overlying field oxide.

Referring now to FIG. 1, a cross-sectional view of two in-process DRAM cells is shown following conventional local oxidation of silicon (LOCOS) or special LOCOS processing which creates substantially planar field oxide regions 1 (created using modified LOCOS process) and future active areas 2 (those regions of the substrate not covered by field oxide) on a silicon substrate 3. The creation of the field oxide is preceded by a thermally grown dielectric layer 4 of silicon oxide. The depicted cells are two of many cells that are fabricated simultaneously and comprise a memory array. Following the creation of the field oxide region 1 and dielectric layer 4 a first conductively doped polysilicon layer 10, a metal silicide layer ($WSi_x$) 15, an oxide layer 16, and a thick nitride layer 20 are deposited. The thick nitride layer 20 will function as an etch stop during the storage node buried contact etch, thus allowing self-alignment. The layers are patterned and etched to form wordlines 21 and N-channel (NCH) field effect transistors 22. The polysilicon layer 10 forms the gate regions of the FETs and is insulated from lightly-doped source/drain regions 25 by the dielectric layer 4. The lightly-doped regions 25 are created utilizing a phosphorus implant. Deposition, densification and a reactive ion etch (RIE) of a silicon dioxide spacer layer has created principal spacers 30 which offset an arsenic implant used to create the heavily-doped source/drain regions 35. Principal spacers 30 insulate the wordlines and FETs from subsequent digit line and capacitor fabrications. Eventually the wordlines are connected to periphery contacts. The periphery contacts are located at the end of the array and are capable of being in electrical communication with peripheral circuitry.

After the RIE etch the punchthrough improvement implant is processed to improve breakdown voltage of drain to source when $V_{Gate}$ equals zero volts (BVDSS) and to reduce subthreshold leakage. The gate oxide 4 remains intact and the field oxide is not etched.

Although the formation of the FETs 22 and wordlines 21 as described are preferred, other methods of fabrication are also feasible and perhaps equally viable. The following steps represent the method of capacitor fabrication of the preferred embodiment of the invention.

Figure 2:
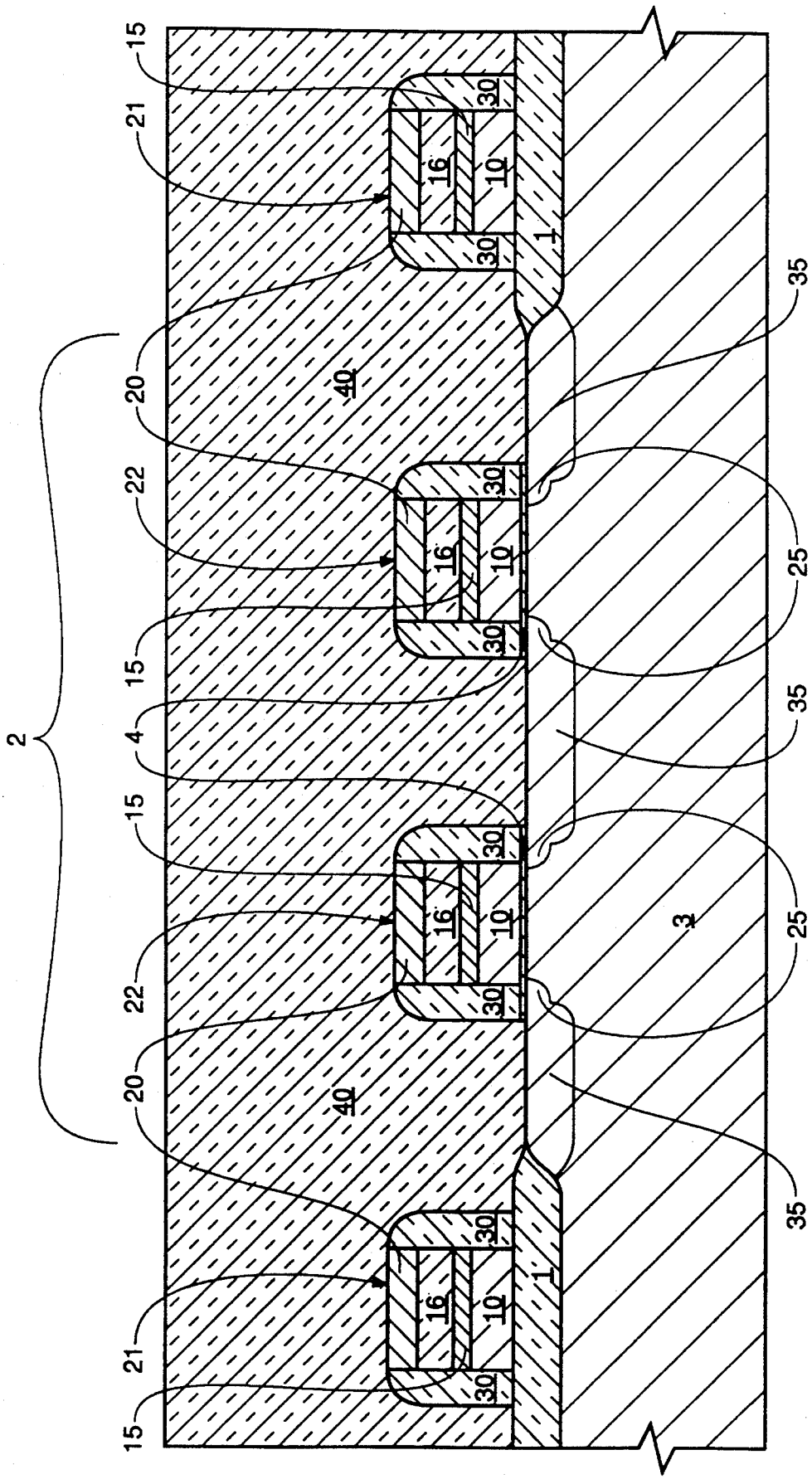
FIG. 2 is a cross-sectional view of the wafer portion of FIG. 1 following the deposit of an undoped thick oxide layer and planarization thereof.

In FIG. 2 a thick conformal doped layer of borophosphosilicate glass (BPSG) oxide interlayer 40 is blanket deposited to fill the storage node areas and overlie the FETS 22 and wordlines 21. The oxide interlayer 40 is deposited to a height selected to define the desired height of the parallel capacitor and is undoped to minimize dopant out diffusion from the oxide interlayer 40 to the doped regions of the substrate. The oxide interlayer 40 is planarized, either mechanically or chemically, in order to provide a uniform height.

Figure 3:
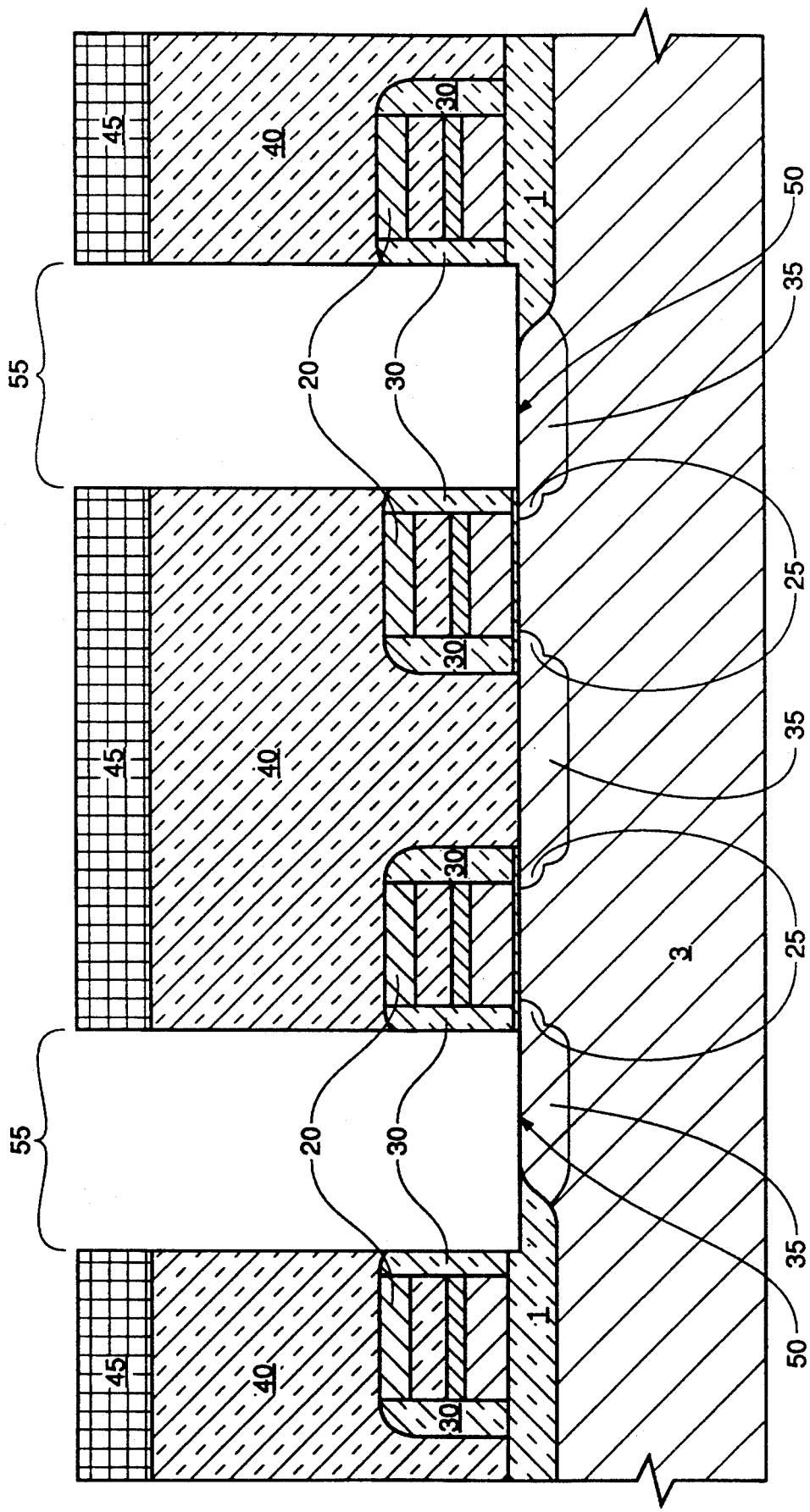
FIG. 3 is a cross-sectional view of the wafer portion of FIG. 2 following the patterning and etching of the undoped thick oxide layer to form an opening exposing a contact area of the substrate.

In FIG. 3 the oxide interlayer 40 of FIG. 2 is masked by photoresist pattern 45 to define the buried contact area 50 of the substrate 3. The oxide interlayer 40 is then RIE etched to form an opening 55 in the oxide interlayer 40 exposing the buried contact area 50. During subsequent process steps the storage node capacitor plate of the preferred embodiment is fabricated to contact the buried contact area 50.

Figure 4:
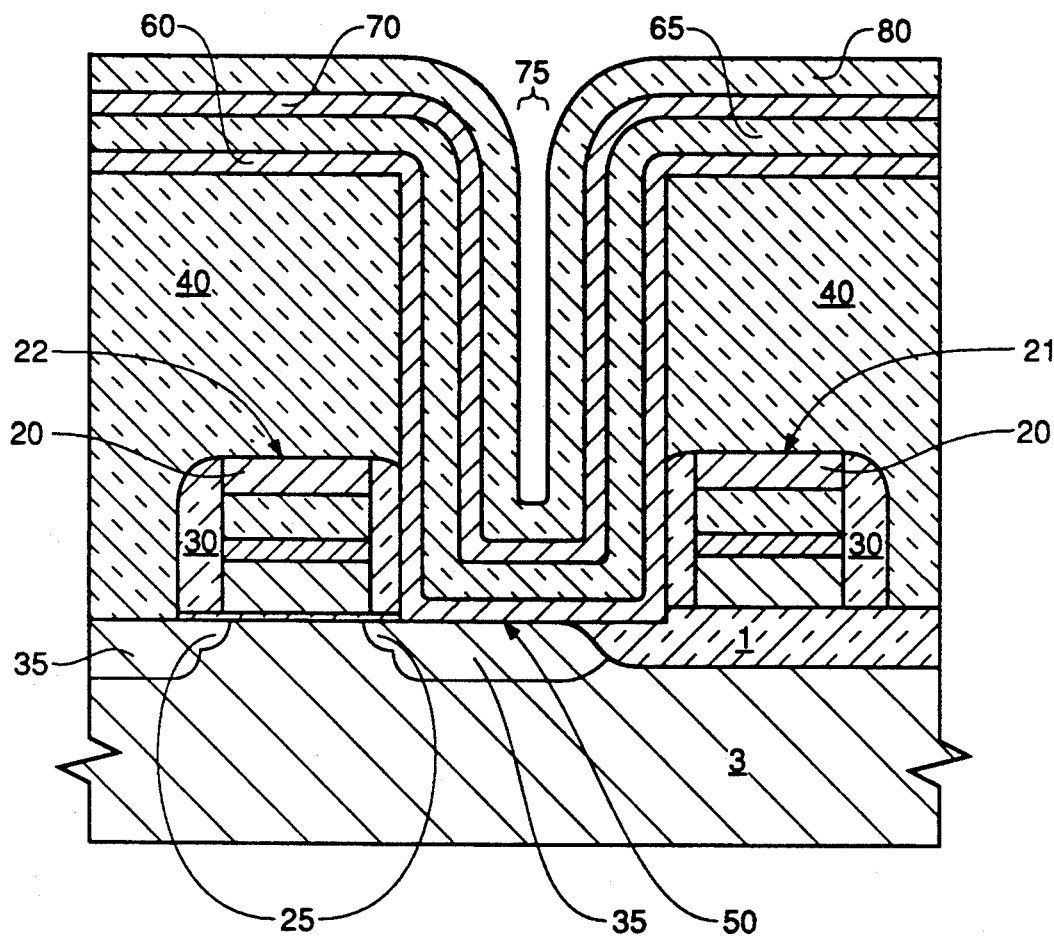
FIG. 4 is a cross-sectional view of the wafer portion of FIG. 3 following the alternating depositions of polycrystalline silicon and oxide deposited to fill all but a channel in the opening of FIG. 3.

In FIG. 4 the photoresist pattern 45 of FIG. 3 is removed. FIG. 4 depicts the initial blanket deposit of a polycrystalline silicon layer 60 insitu doped with phosphorous. The polycrystalline silicon layer 60 overlies the buried contact area 50 and the oxide interlayer 40. The initial polycrystalline silicon layer 60 deposit is followed by alternating depositions of oxide 65 and polycrystalline silicon 70 insitu doped with phosphorous. The total number of alternating depositions 65 and 70 selected is determined by the DRAM designer. The depositions do not completely fill the opening 55 and a channel 75 is centered in a final deposition of oxide 80.

Figure 5A:
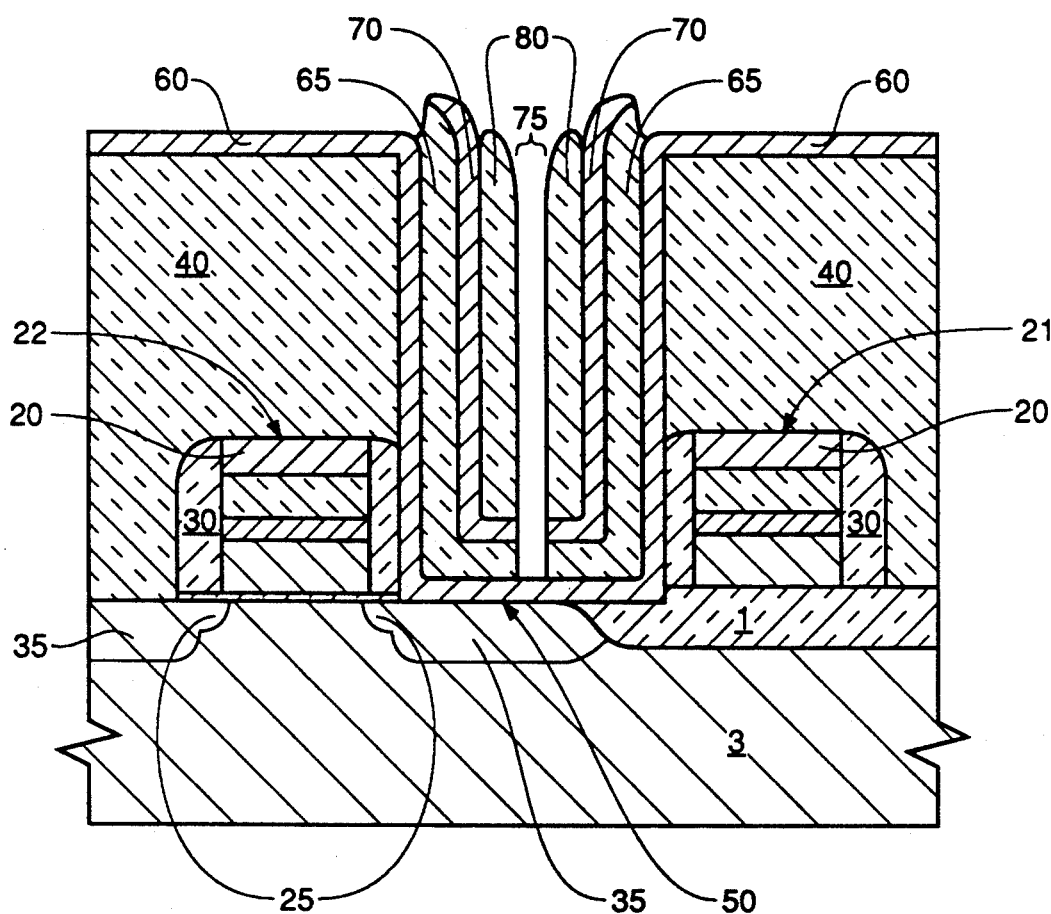
FIG. 5A is a cross-sectional view of the wafer portion of FIG. 4 following an alternating insitu reative ion etch (RIE) of the alternating layers of polycrystalline silicon and oxide. The insitu etch is performed in order to expose an initial polycrystalline layer.

In the preferred embodiment shown in FIG. 5A an alternating RIE insitu etch removes horizontal portions of the alternating layers of polycrystalline silicon 70 and oxide 65 and the final oxide deposition 80. Final oxide deposition 80 is retained overlying vertical sidewalls of the final deposit of polycrystalline silicon 70 forming filaments that function as a mask pattern for increasing the depth of the channel 75 during the RIE insitu etching. The RIE insitu etching increases the depth of channel 75 and exposes a portion of the polycrystalline silicon 60 overlying the buried contact region. The initial polycrystalline silicon layer 60 is not etched during these alternating etches.

Figure 5B:
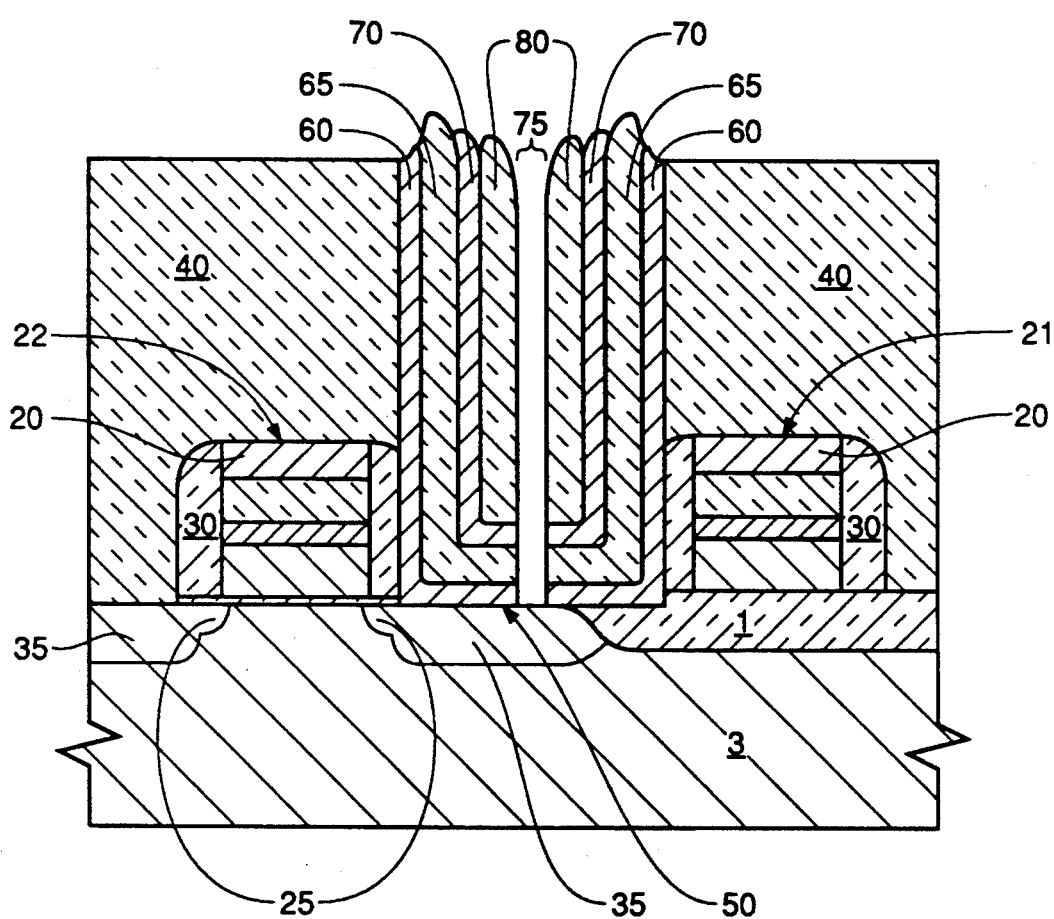
FIG. 5B is an alternate cross-sectional view of the wafer-portion of FIG. 4 following an alternating insitu RIE etch of the alternating depositions of polycrystalline silicon and oxide. The insitu etch is performed in order to expose the substrate.

In an alternate embodiment shown in FIG. 5B the alternating insitu etch is continued in order to etch the initial deposit of polycrystalline silicon 60 according to the mask pattern provided by oxide deposition 80 in order to expose the substrate 3 in the contact area 50. Etching of the initial polycrystalline silicon layer 60 is typically a more delicate process since the etching may result in punch through of the contact area 50 when the substrate 3 is exposed.

An alternating insitu etch is a plural etch within a single etch step. In the preferred and alternate embodiments the oxide etch is timed until the final oxide is removed by the etch. The oxide etch is then turned off. Next the silicon etch is timed until the silicon is removed, and then the silicon etch is turned off. The process is repeated until the layers have been etched to expose the initial polycrystalline silicon layer in the preferred embodiment or the substrate in the alternate embodiment.

Figure 6A:
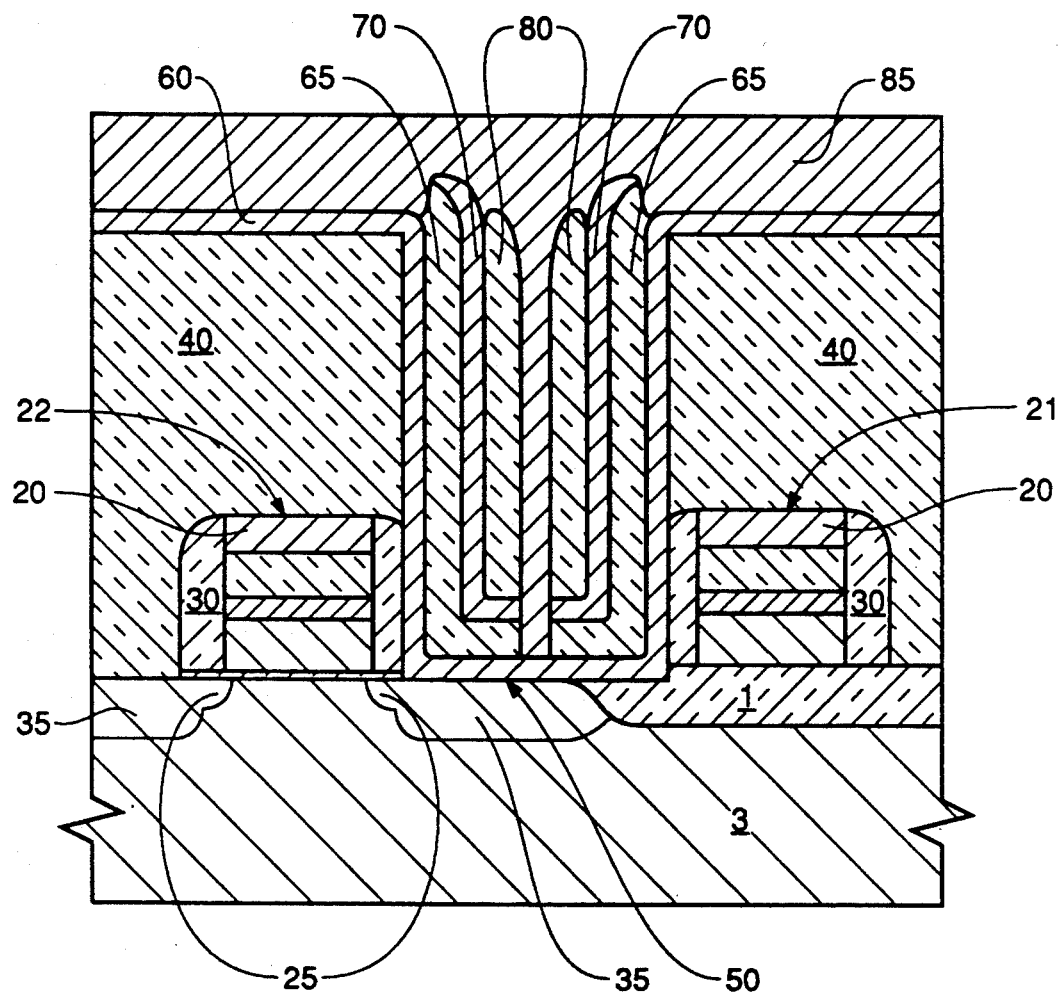
FIG. 6A is a cross-sectional view of the wafer portion of FIG. 5A following a conformal deposition of polycrystalline silicon to fill the channel of FIG. 5A.

In FIG. 6A a conformal polycrystalline silicon layer 85 is deposited to completely fill the channel 75 of FIG. 5A and contact the initial polycrystalline silicon deposition 60 and all alternating polycrystalline silicon depositions 70 exposed during the etching, thereby providing electrical communication between all polycrystalline silicon layers. The polycrystalline silicon layer 85 is insitu doped with phosphorus.

Figure 6B:
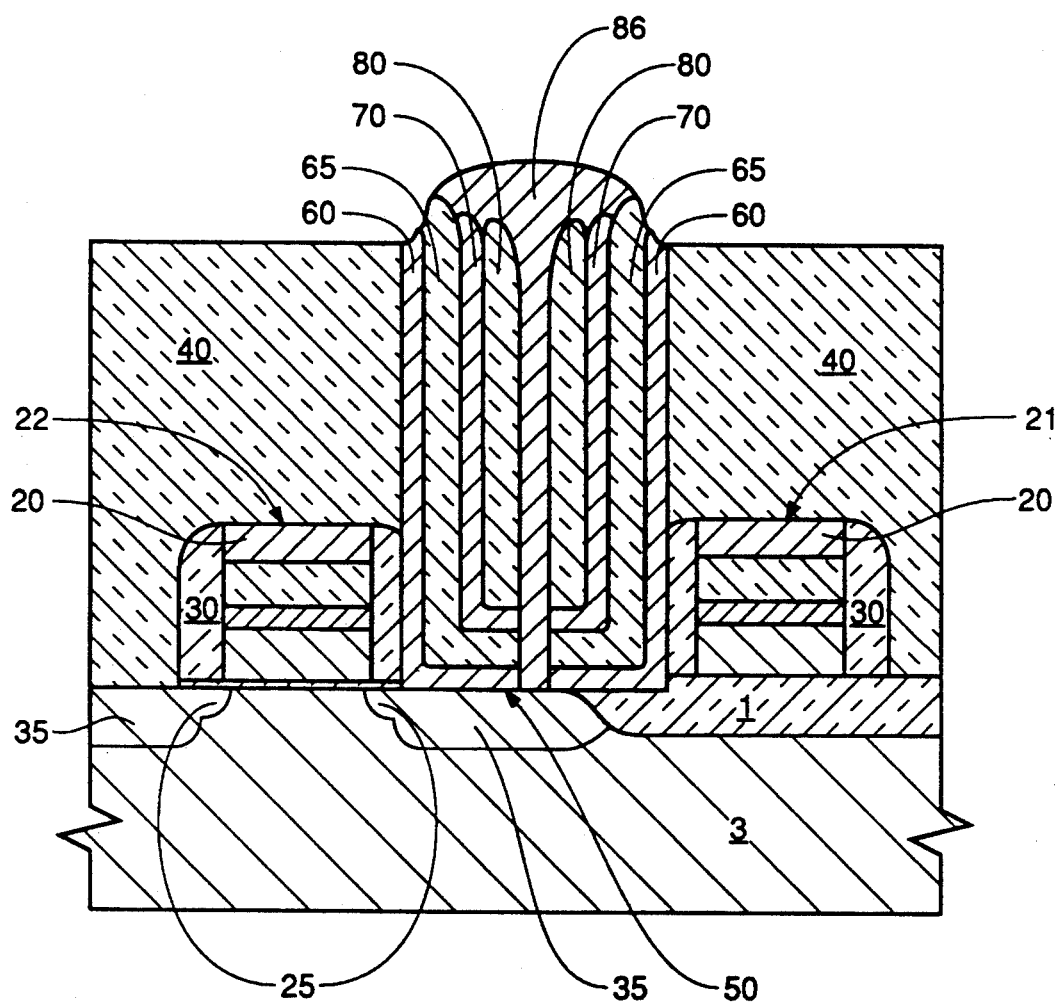
FIG. 6B is a cross-sectional view of the wafer portion of FIG. 5B following the growth of epitaxial silicon to fill the channel of FIG. 5B.

In the alternate embodiment shown in FIG. 6B silicon 86 may be epitaxially grown from the monocrystalline silicon contact area 50 exposed during the etch of the polycrystalline silicon layer 60. The epitaxial silicon eventually fills channel 75 of the FIG. 5B and functions electrically as the polycrystalline silicon layer 85, thereby providing electrical communication between itself and polycrystalline silicon layers 60 and 70. Typically, growing epitaxial silicon is a relatively expensive and a relatively slow process, therefore it is not preferred.

Figure 7A:
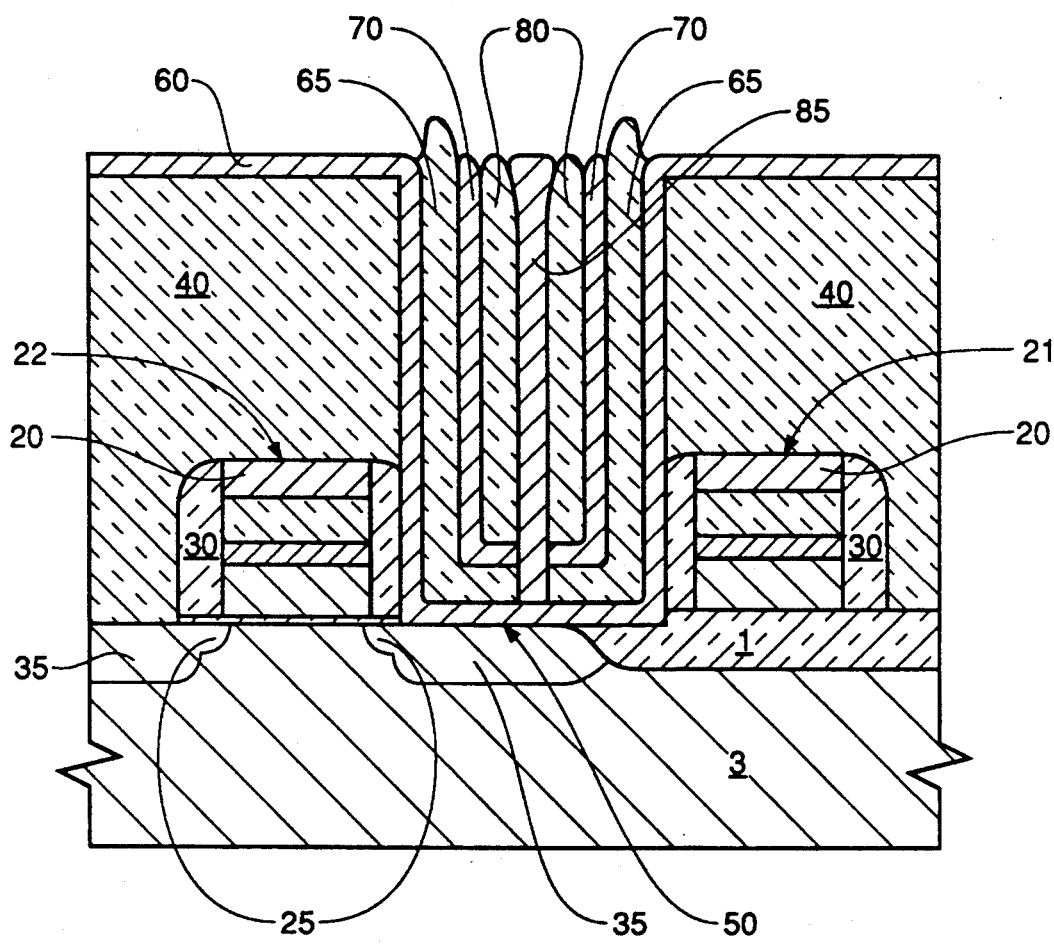
FIG. 7A is a cross-sectional view of the wafer portion of FIG. 6A following the removal of the polycrystalline silicon deposit of FIG. 6A to exposed the oxide layers.

In FIG. 7A a wet poly etch is utilized to expose the oxide depositions 65 and 80 of FIG. 7A while retaining the initial polycrystalline silicon layer 60 and the polycrystalline silicon depositions 70 and 85 formed in the opening 55 of FIG. 3.

Figure 7B:
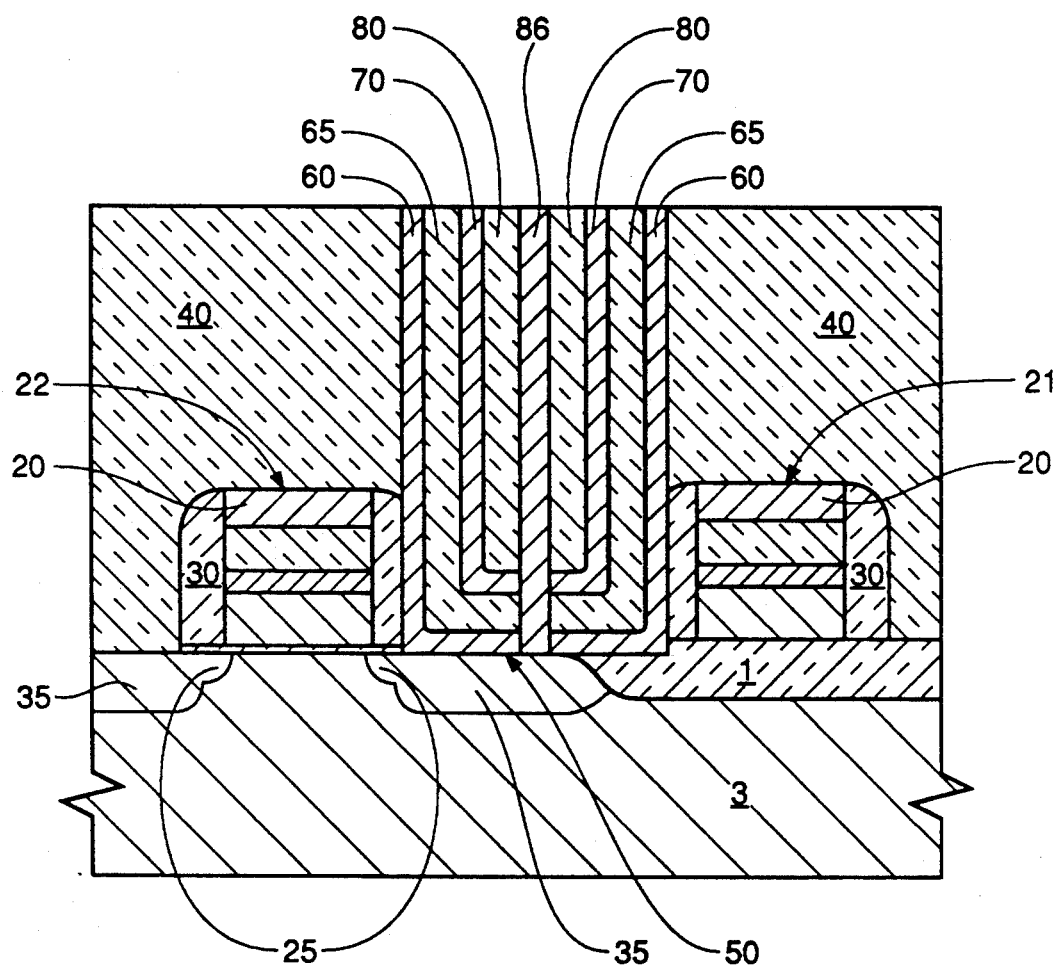
FIG. 7B is a cross-sectional view of the wafer portion of FIG. 6B following the removal of the epitaxial silicon of FIG. 6B. Alternately FIG. 7B can represent a cross-sectional view of the wafer portion of FIG. 6B after a planarization of the alternate layers of polycrystalline silicon and oxide, and the polysilicon deposit of FIG. 6B.

Optionally the polycrystalline layers 60, 70, and 85 and the oxide layers 65 and 80 can be chemically mechanically planarized in order to expose the oxide layers 65 and 80 and interlayer 40. This wafer portion would then look similar to the wafer portion of FIG. 8B where the layers 60, 65, 70, 80 and 86 of the alternate embodiment of FIG. 7B have been planarized to expose the oxide layers 65 and 80. A wet etch of the silicon layer 86 is a viable alternative to the planarization and effects a similar cross-sectional view as well as a similar functionality.

Figure 8A:
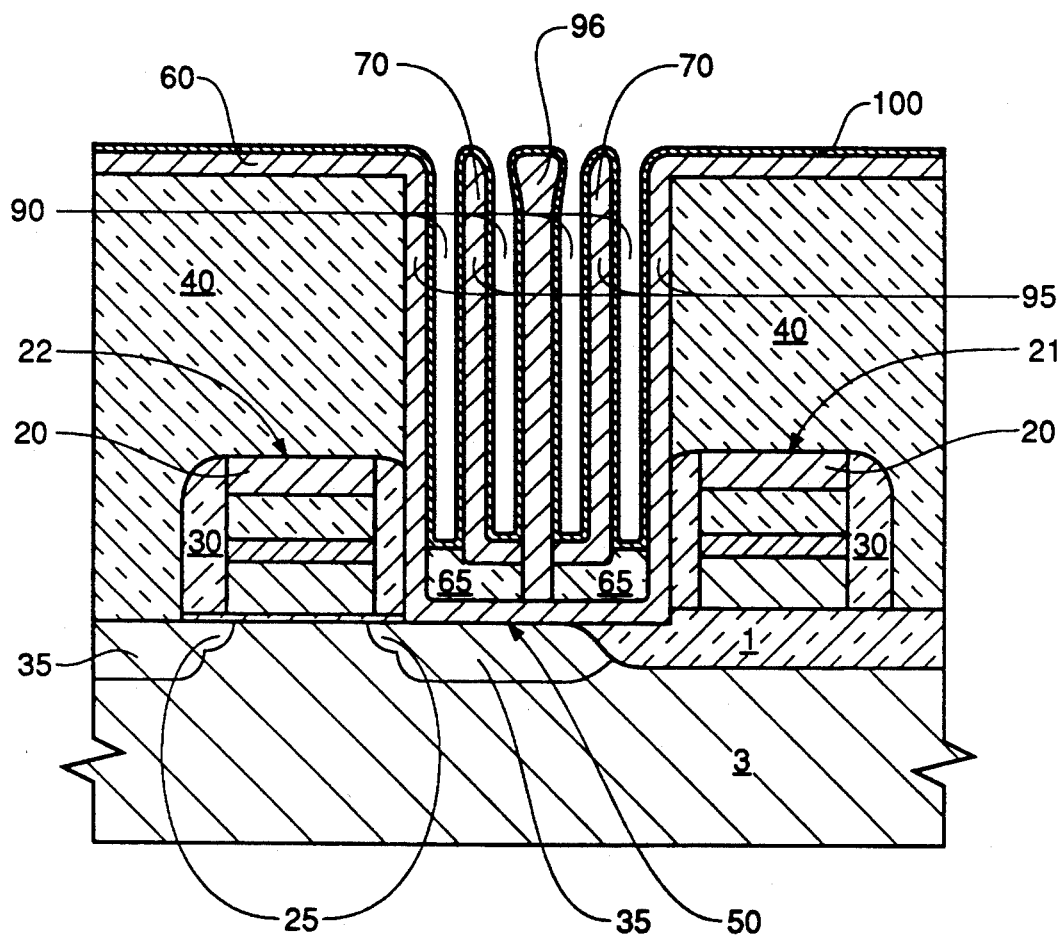
FIG. 8A is a cross-sectional view of the wafer portion of FIG. 7A following etching of the oxide layers and a deposition of a dielectric layer comprising silicon nitride.

In FIG. 8A of the preferred embodiment and 8B of the alternate embodiment the oxide layers have been selectively and controllably etched by either a wet or a vapor etch method to form cavities 90 between the silicon layers. The cavities 90 form parallel annular rings 95 and a parallel center fin 96. The annular rings 95 are in electrical communication one with another via the center fin 96, formed by the silicon layers 85 and 86 respectively. These annular rings 95 and center fin 96 eventually comprise the storage node capacitor plate of the storage node capacitor of the invention. The horizontal component of the oxide 65 is retained after the etch to provide stability to the annular rings 95. Since the initial polycrystalline layer 60 was not etched during the insitu etch described relative to FIG. 5A, the annular rings 95 and center fin 96 have a maximum height in the preferred embodiment. This maximum height effects maximum capacitance.

Figure 8B:
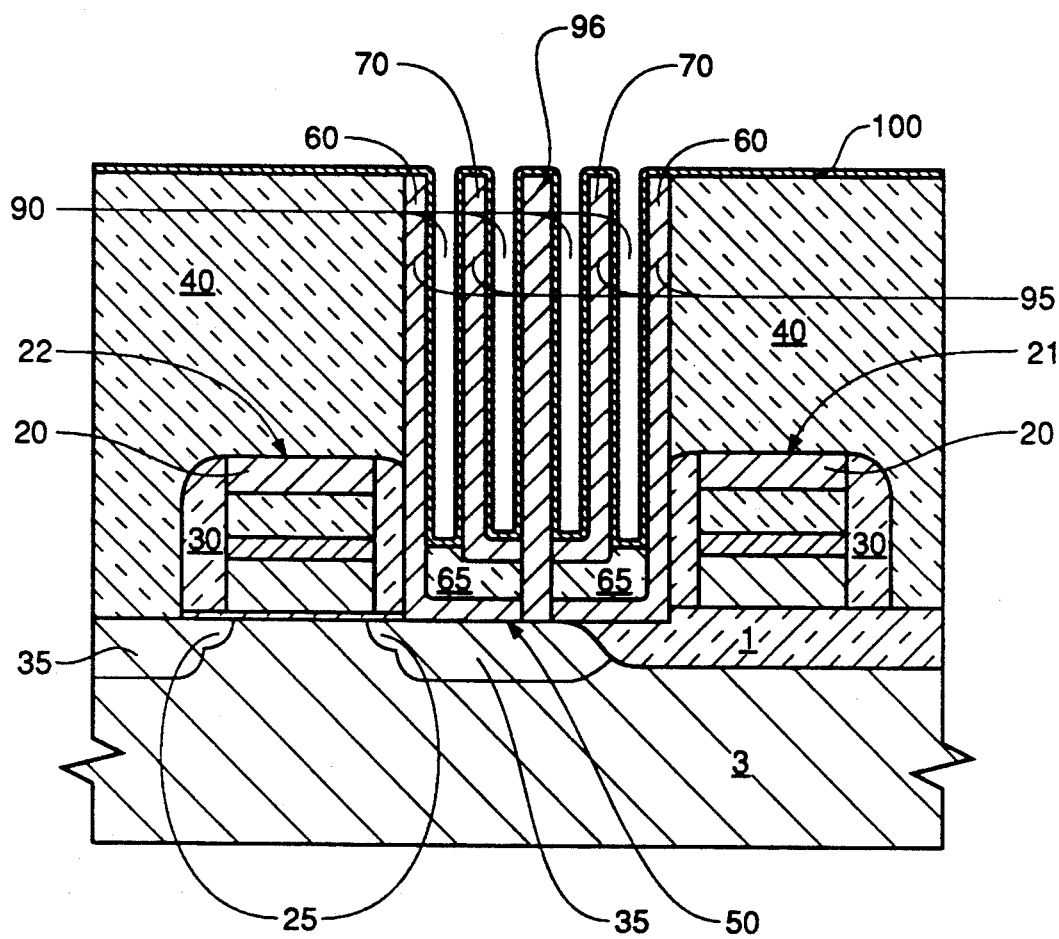
FIG. 8B is a cross-sectional view of the wafer portion of FIG. 7B following etching of the oxide layers and a deposition of a dielectric layer comprising silicon nitride.

Still referring to FIGS. 8A and 8B a thin cell nitride dielectric layer 100 is then deposited to overlie all of the exposed silicon and oxide surfaces. An optional wet anneal may be performed subsequent to the silicon nitride deposition to oxidize the silicon in pinholes of the nitride. The wet anneal improves dielectric breakdown properties of the capacitor thus formed.

Figure 9A:
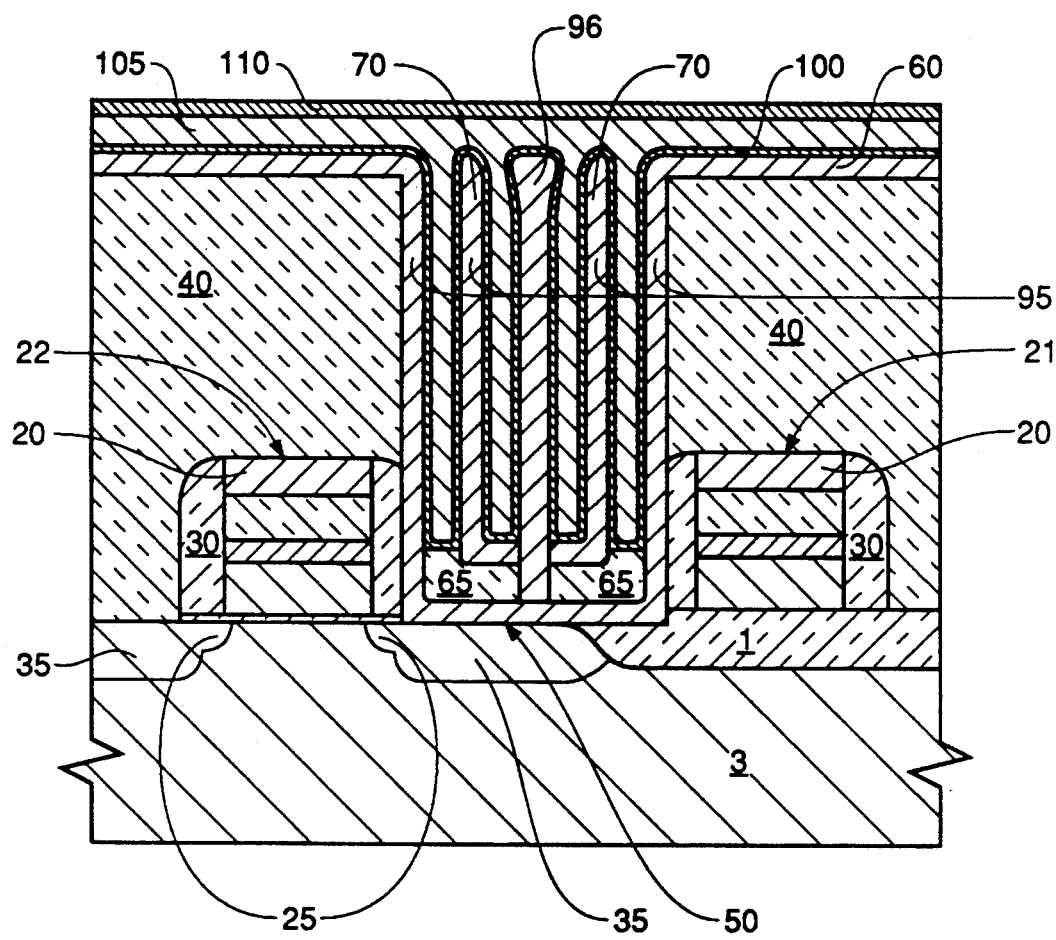
FIG. 9A is a cross-sectional view of the wafer portion of FIG. 8A following the deposition of a cell polycrystalline silicon layer and a temporary deposition of silicon nitride.
Figure 9B:
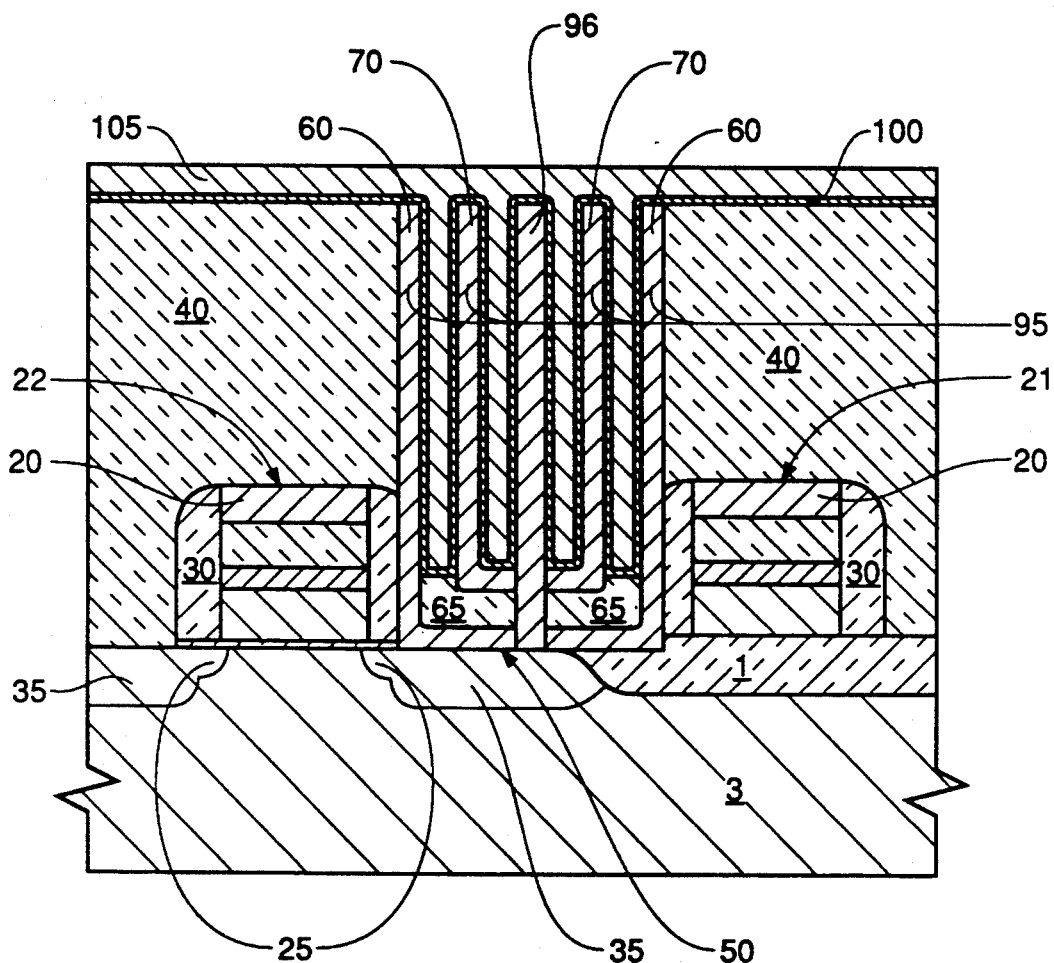
FIG. 9B is a cross-sectional view of the wafer portion of FIG. 8B following the deposition of a cell polycrystalline silicon layer.

In FIG. 9A of the preferred embodiment and 9B of the alternate embodiment a thick cell polycrystalline silicon layer 105 is deposited to overlie the thin nitride dielectric layer 100 of FIGS. 8A and 8B respectively. As the polycrystalline silicon layer 105 is deposited it is insitu doped with phosphorus. The cell polycrystalline silicon layer 105 will comprise the upper capacitor plate of the storage node capacitor. In FIG. 9A a thin oxidation resistant nitride dielectric layer 110 is blanket deposited to overlie the cell polycrystalline silicon layer 105 and offers protection against oxidation of a majority of the cell polycrystalline silicon layer 105 in subsequent processing steps.

Figure 10:
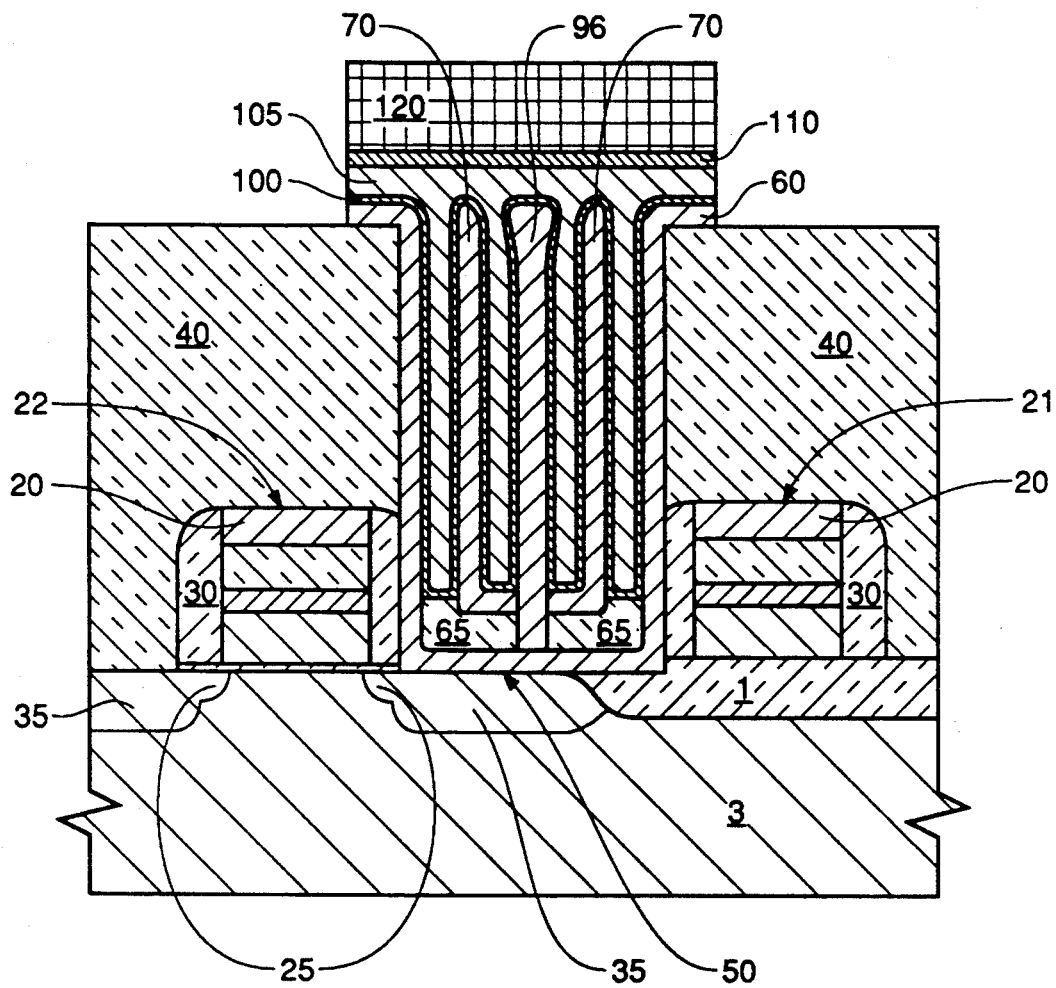
FIG. 10 is a cross-sectional view of the wafer portion of FIG. 9A following the patterning and etching of the storage node capacitor plate.

In the preferred embodiment as shown in FIG. 10 the cell polycrystalline silicon layer 105 and the storage node polycrystalline silicon layer 60 are patterned only within the storage capacitor with photoresist mask 120. The cell polycrystalline silicon layer 105, nitride dielectric layers 100 and 110 and storage node polycrystalline silicon layer 60 are RIE etched in the unmasked regions. It is not necessary to use a wet poly etch in this process. The polycrystalline silicon layer 60 remaining after the etch comprises the storage node capacitor plate of the storage node capacitor of the preferred embodiment.

Figure 11:
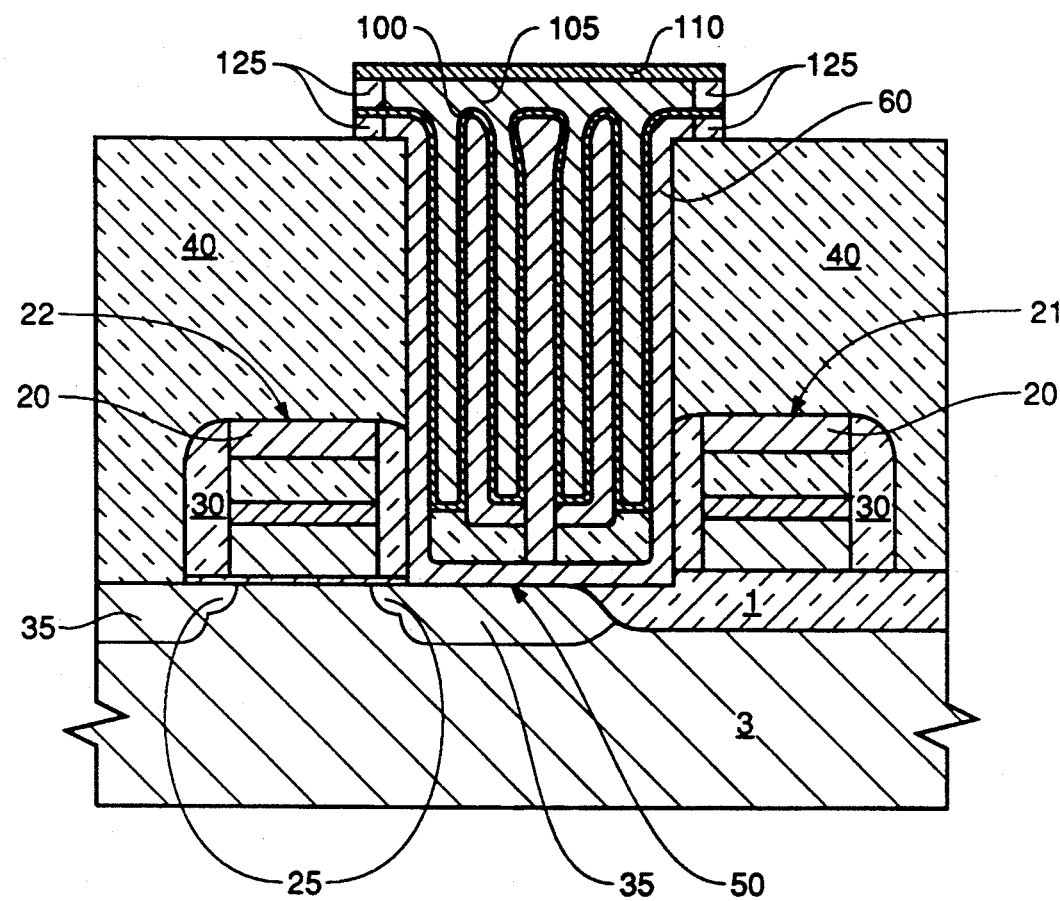
FIG. 11 is a cross-sectional view of the wafer portion of FIG. 10 following the oxidation of the storage node polycrystalline silicon exposed during the etch of the storage node capacitor plate.

In FIG. 11 the storage node pattern 120 is removed and the ends 125 of the storage node polycrystalline silicon layer 60 and the cell polycrystalline silicon layer 105 are oxidized in order to insulate the storage node polycrystalline silicon layer 60 from subsequent poly depositions. Although the cell polycrystalline silicon layer 105 is oxidized during this step, this oxidation is irrelevant to the process.

Figure 12A:
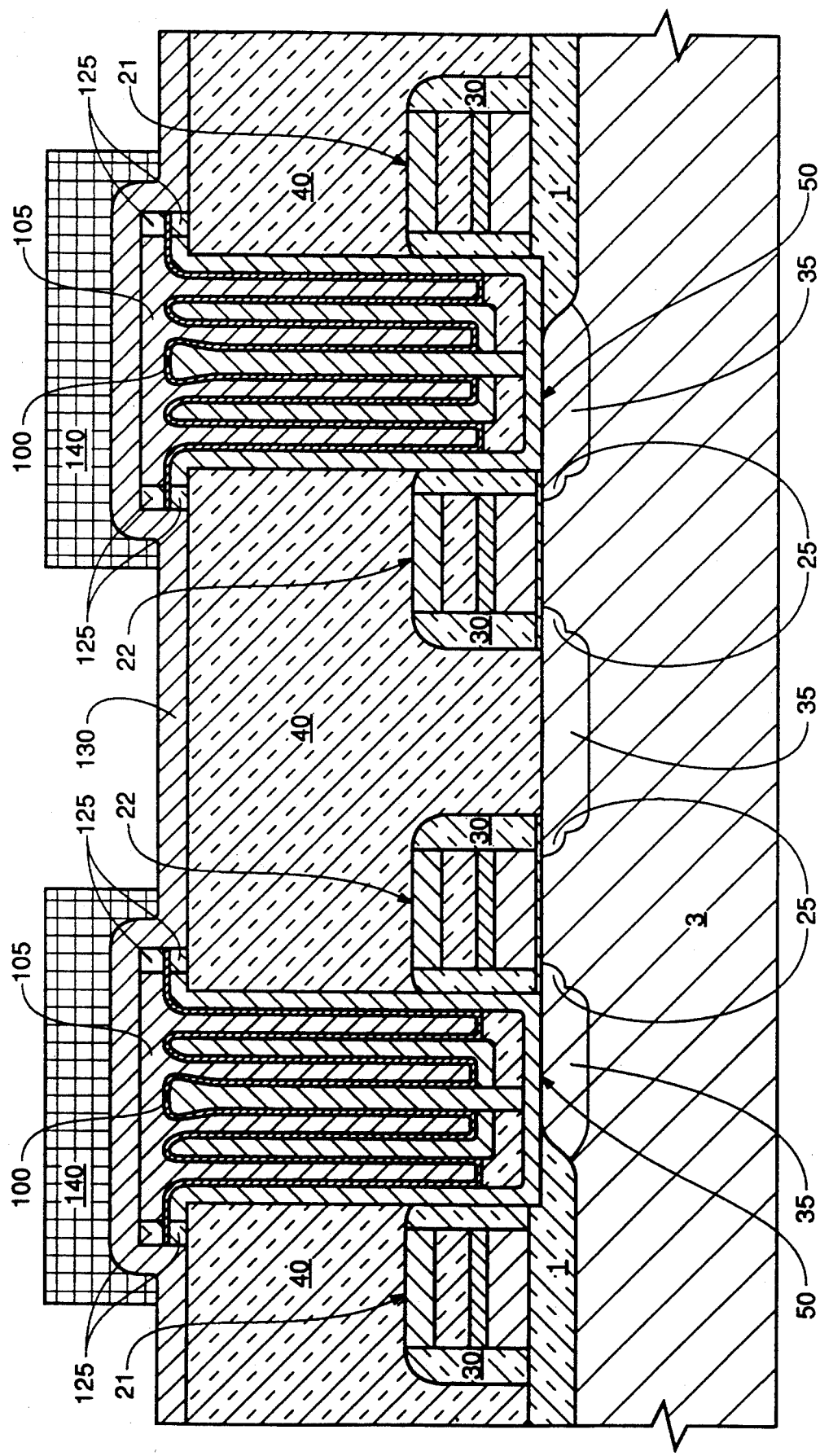
FIG. 12A is a cross-sectional view of the wafer portion of FIG. 11 following the etch of the temporary silicon nitride layer, the deposition of a second cell polycrystalline silicon layer, and the patterning of a cell polycrystalline silicon interconnect.

In FIG. 12A of the preferred embodiment the upper nitride layer 110 is removed with an RIE etch. A relatively thin layer of polycrystalline silicon layer 130 is blanket deposited to overlie and be in electrical communication with the cell polycrystalline silicon layer 105 and thick oxide layer 40. The thin layer of polycrystalline silicon layer 130 is contiguous to all of the cells of the array. The thin polycrystalline silicon layer 130 is insitu doped with phosphorus. The polycrystalline silicon layer 130 is masked with an interconnect pattern 140 which defines electrical interconnection of the cells of the array. The thin polycrystalline silicon layer 130 is RIE etched according to the interconnect pattern.

Figure 12B:
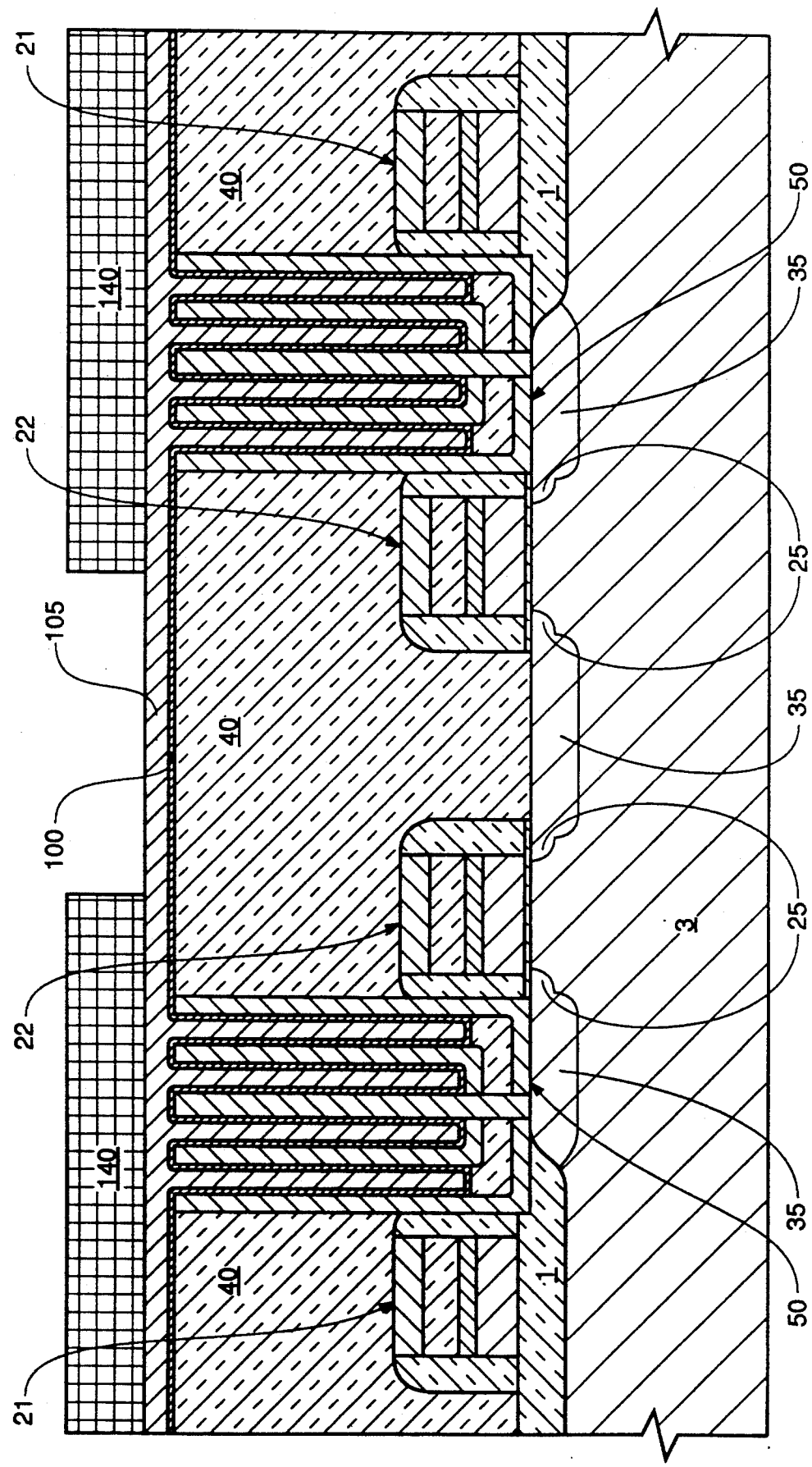
FIG. 12B is a cross-sectional view of the wafer portion of FIG. 9B following the patterning of the cell polycrystalline silicon interconnect.

In FIG. 12B of the alternate embodiment the cell polycrystalline silicon layer 105 is masked with an interconnect pattern 140 which defines electrical interconnection of the cells of the array. The cell polycrystalline silicon layer 105 is RIE etched according to the interconnect pattern.

Figure 13A:
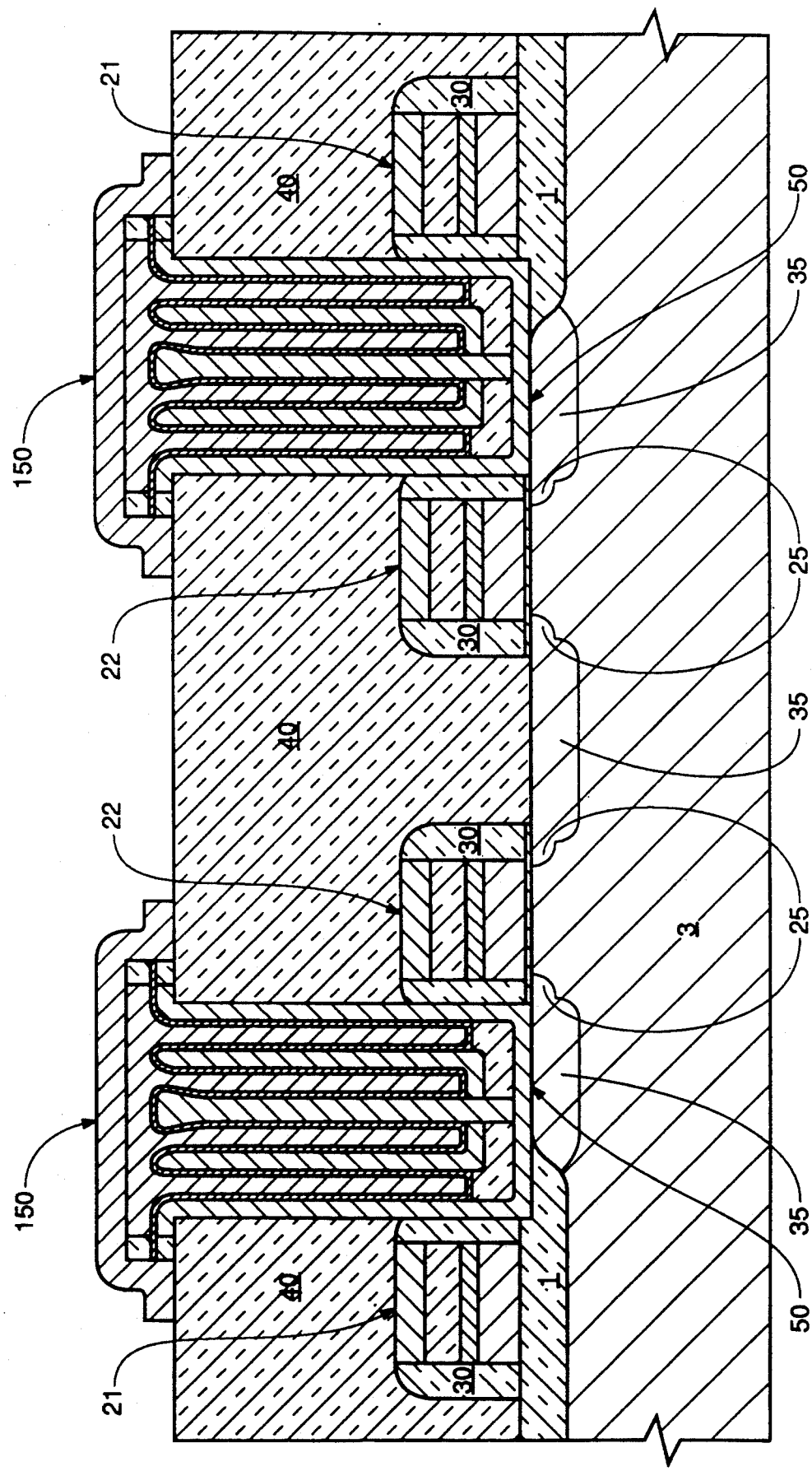
FIG. 13A is a cross-sectional view of the wafer portion of FIG. 12A following the etch of the cell polycrystalline silicon interconnect and the removal of the cell polycrystalline silicon mask.
Figure 13B:
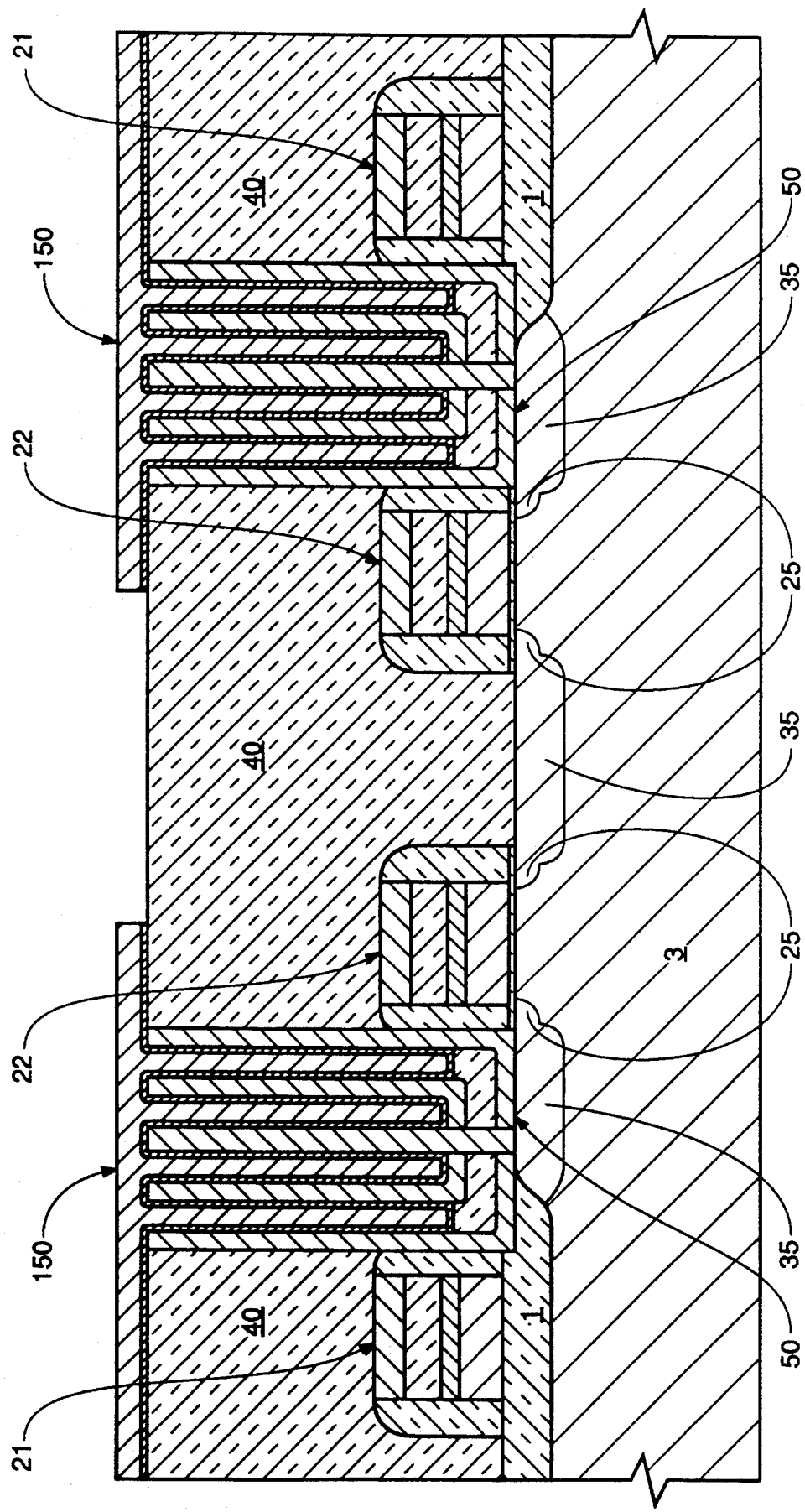
FIG. 13B is a cross-sectional view of the wafer portion of FIG. 12B following the etch of the cell polycrystalline silicon interconnect and the removal of the cell polycrystalline silicon mask.
Figure 14A:
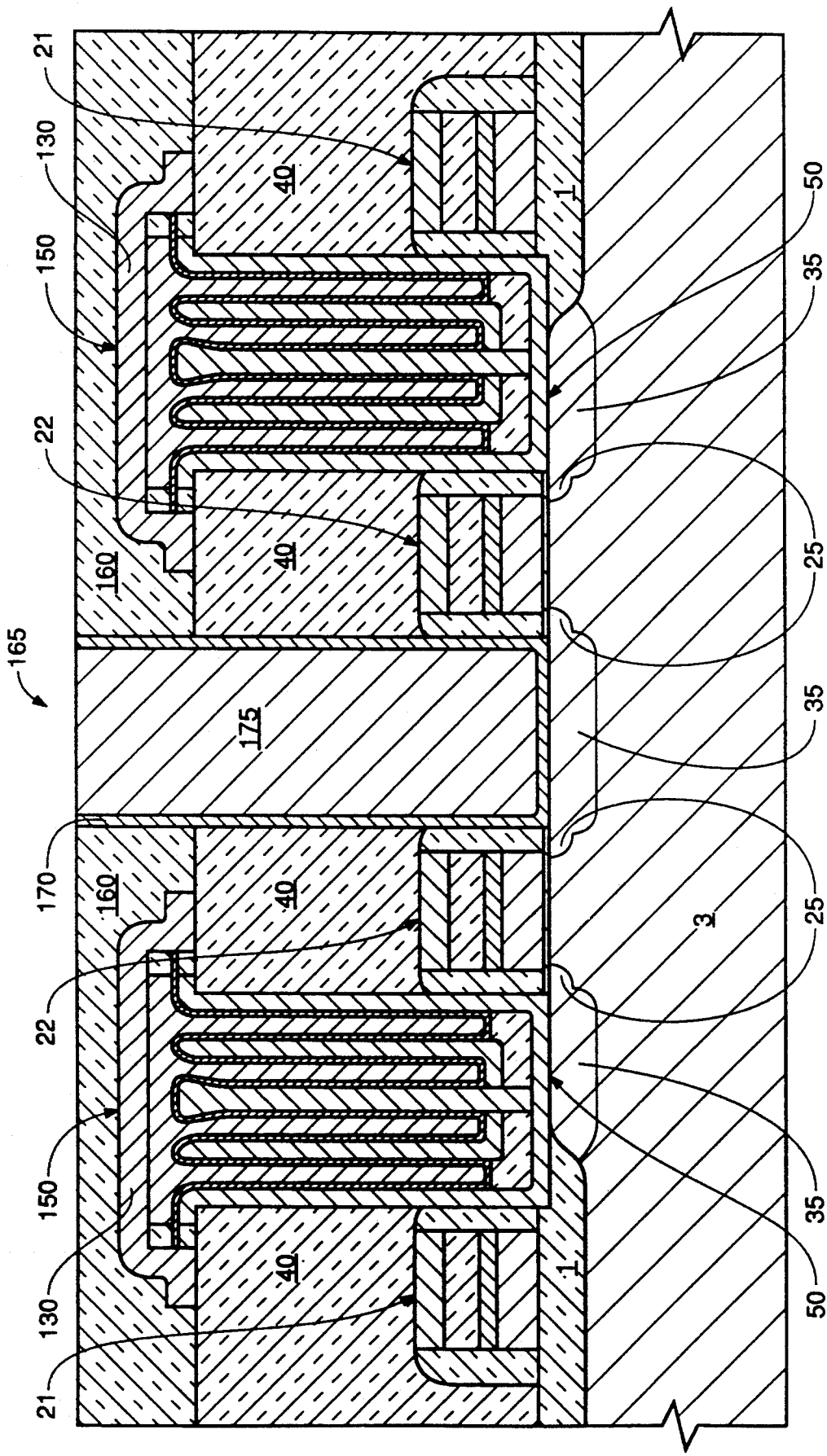
FIG. 14A is a cross-sectional view of the wafer portion of FIG. 13A following the formation of a tungsten plug.
Figure 14B:
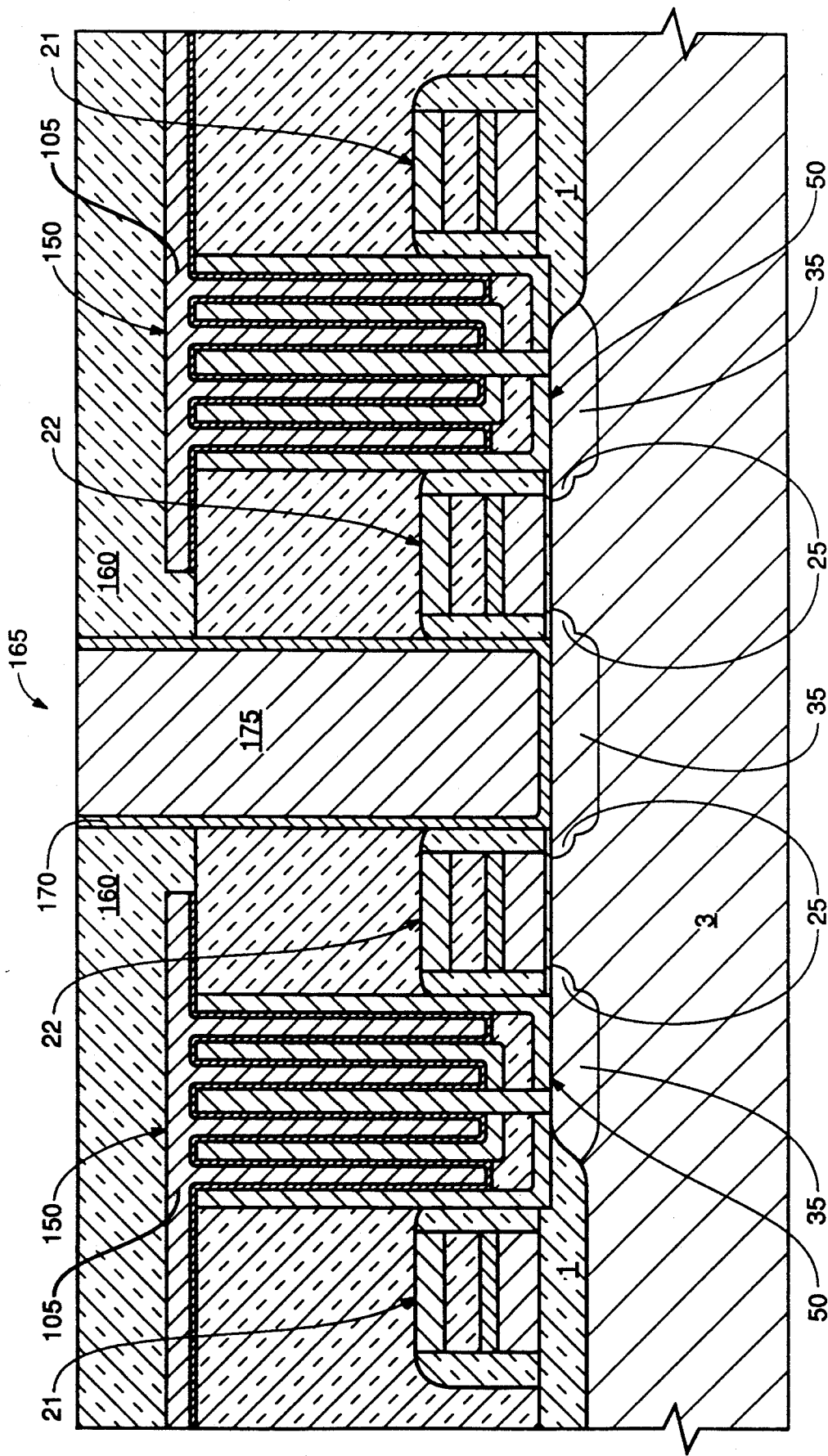
FIG. 14B is a cross-sectional view of the wafer portion of FIG. 13B following the formation of a tungsten plug.

FIGS. 13A of the preferred embodiment and 13B of the alternate embodiment depict the storage node capacitor 150 of the invention following the RIE etches of the thin polycrystalline silicon layer 130 in FIG. 14A and the cell polycrystalline silicon layer 105 in 14B. With the removal of the interconnect pattern 140 the fabricated storage node capacitor 150 formation of the preferred and alternate embodiments, respectively, is complete.

FIG. 14A of the preferred embodiment and 14B of the alternate embodiment depict the completion of the interconnect process. An approximately 3 KA thick dielectric oxide deposition 160 is deposited overlying the thin polycrystalline silicon layer 130 and the cell polycrystalline silicon layer 105 respectively. Subsequently a contact mask (not shown) is used as a pattern to etch a contact hole (not shown) in the oxide layers 160 and 40. An RIE etch exposes the substrate 3. The contact mask is removed. A contact plug 165 is formed in the contact hole by first depositing a TiN layer 170 followed by a conformal deposition of tungsten 175 to fill the contact hole. The final formation of the contact plug results from the etchback of the TiN 170 and tungsten 175 to expose the oxide layer 160, thus retaining TiN 170 and tungsten 175 only in the contact hole.

Figure 15A:
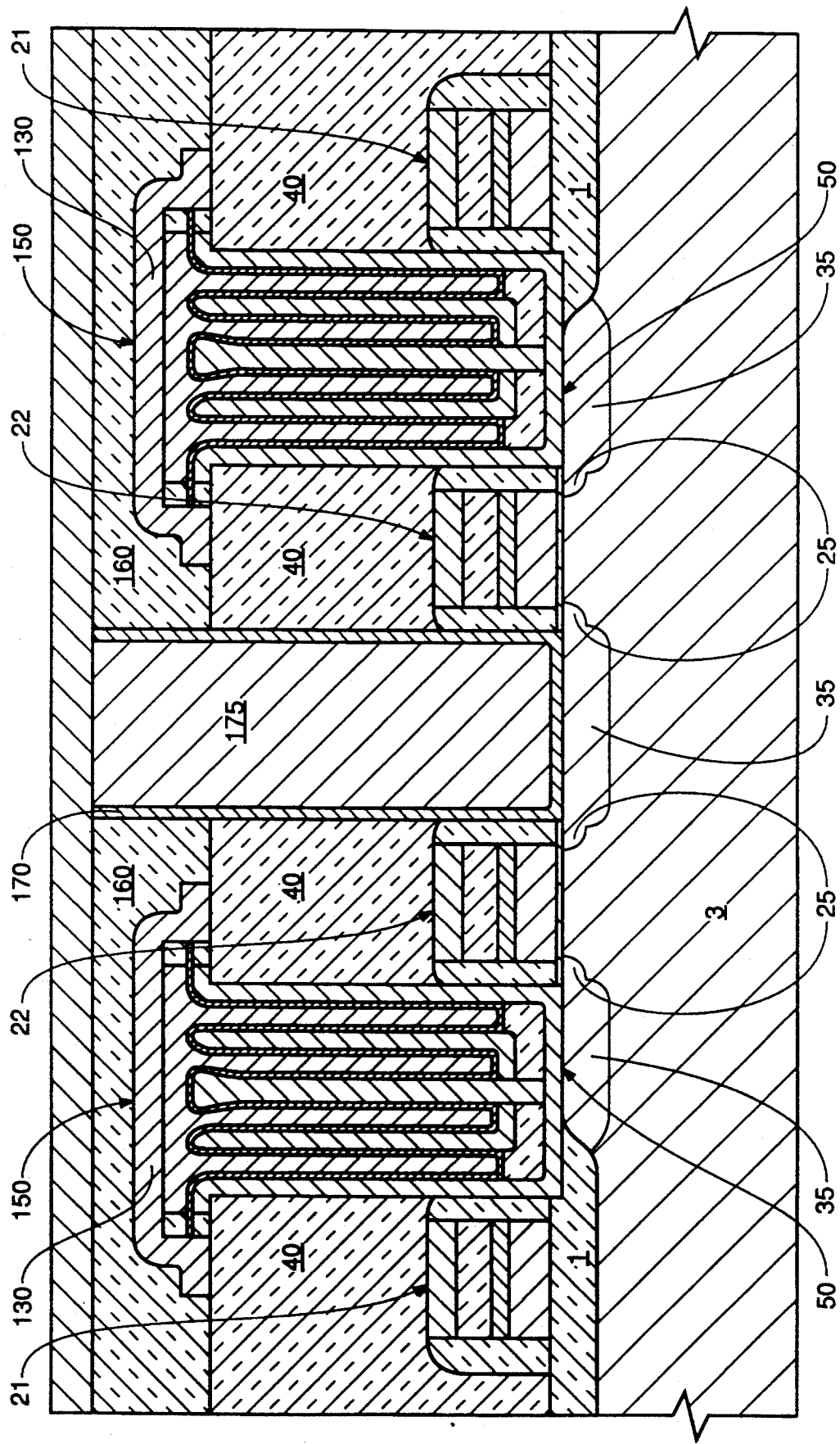
FIG. 15A is a cross-sectional view of the wafer portion of FIG. 14A following the patterning of metallic interconnect lines for providing an electrical connection between the tungsten plugs and peripheral contacts of the DRAM.
Figure 15B:
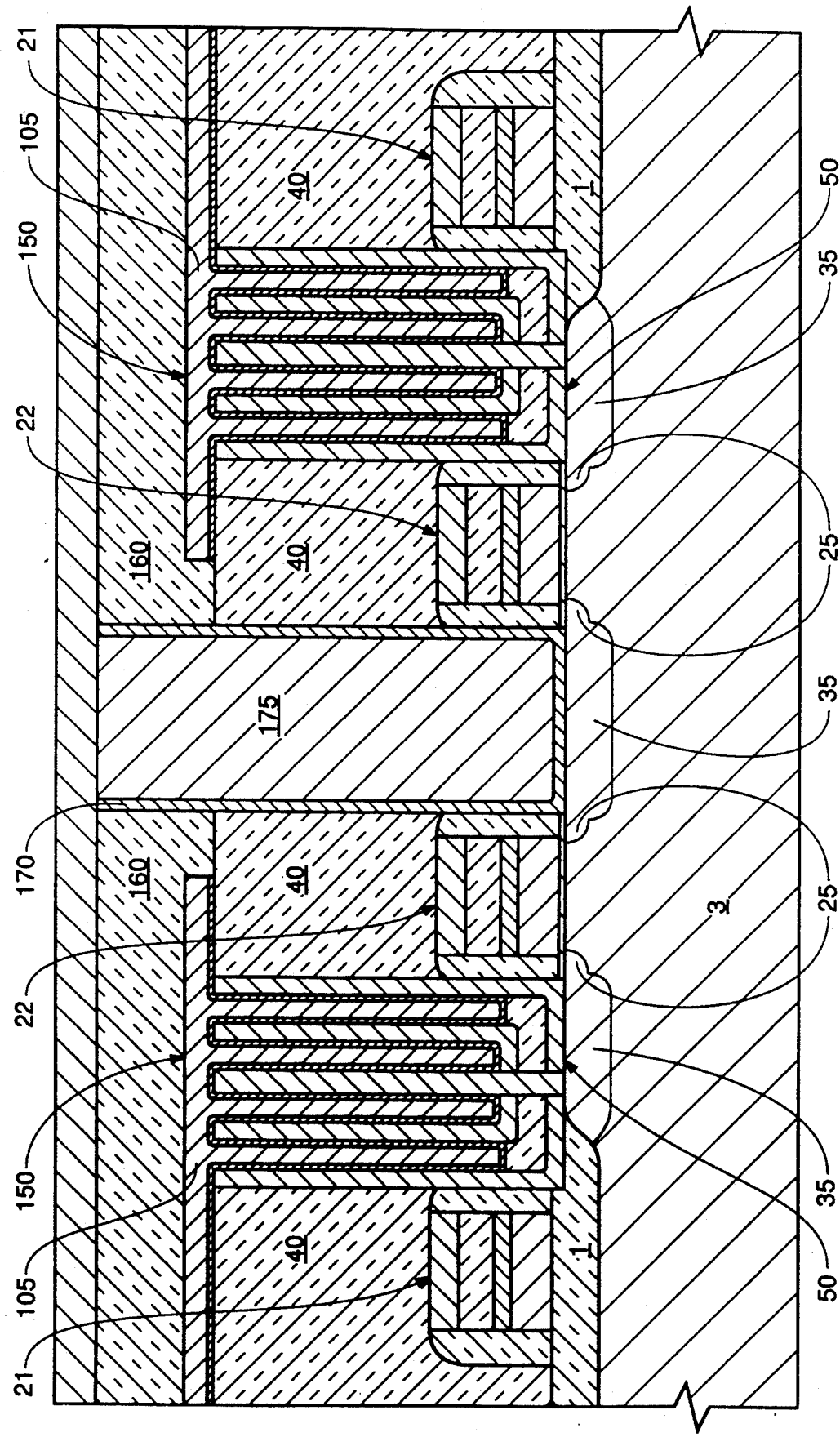
FIG. 15B is a cross-sectional view of the wafer portion of FIG. 14B following the patterning of metallic interconnect lines for providing an electrical connection between the tungsten plugs and peripheral contacts of the DRAM.

In FIG. 15A of the preferred embodiment and 15B of the alternate embodiment interconnect lines are formed using an RIE etch after a metalization layer 190 overlying the dielectric oxide layer 160 is patterned with a digit line interconnect pattern (not shown). The digit lines thus formed provide electrical communication between the interconnect tungsten plugs 165 and the peripheral contacts (not shown) of the cell array. No passivation layers are shown.

It should be noted that for a parallel capacitor height of approximately 1 micron the capacitor will have a capacitance of 30 microfarads in a 0.6 micron contact hole. Since an increase in capacitance is directly proportional to increase in capacitor area, increasing the capacitor height increases the capacitance.

In summary, the invention allows the vertical portion of a DRAM device to be utilized as the storage cell thus maximizing die space in the horizontal direction, and reducing the stack capacitor height prior to contacts. The formation of multiple annular rings in addition to a center fin increases the capacitor area in a given lateral area thus increasing capacitance.

Even though the capacitor can encroach the area over the wordline, the cell plate contact and the cell plate are self-aligned. The capacitor cell is compact since the buried contact size remains the same even though the contact hole is larger when encroaching the area over the wordline.

It can be seen that the process utilizes minimal masking steps and facilitates the effective use of a buried digit line tungsten plug configuration. The invention is conducive to fabricating the capacitor and tungsten plug in an adjacent relationship. In addition, there are no bit line stringers, thus yield is increased.

Although the preferred embodiment is typically employed in DRAMs containing up to 256 megabit DRAM cells, the process is not limited to these uses.

Although specific crystalline silicon structures have been described in the preferred and alternate embodiments, amorphous, monocrystalline, and polycrystalline silicon structures may be substituted as desired. It is also conceivable that a starting substrate comprising another material other than silicon may be employed in this invention with equal success thereby necessitating the epitaxial growth of that alternate starting substrate to fill the cavity. Of course other conductive materials may replace the doped polycrystalline silicon and remain within the scope of the invention as claimed.

Although a preferred and an alternate embodiment of the invention have been herein described, it will be apparent to one skilled in the art that changes and modifications may be made thereto without departing from the spirit and scope of the invention as claimed.

We claim:

1. A method for fabricating a capacitor in a semiconductor comprising:
    a) forming a dielectric isolation interlayer to overlie previously fabricated semiconductor structures and a substrate of said semiconductor device;
    b) forming an opening in said interlayer to expose a contact area of said substrate;
    c) depositing in said opening an initial conductive layer to overlie said interlayer, said previously fabricated structures, and said contact area;
    d) alternately depositing alternating layers, said alternating layers including at least one alternate insulative layer and at least one alternate conductive layer to overlie said initial conductive layer, said alternate depositing initiated with an alternate insulative layer and terminated with a final alternate conductive layer;
    e) forming a masking pattern by depositing a masking insulative layer to overlie said final conductive layer, such that a channel is retained in said opening, said channel defined by sidewalls including said masking insulative layer, said sidewalls forming said masking pattern;
    f) extending said channel in a direction toward said substrate by anisotropically insitu etching, according to said masking pattern, at least said masking insulative layer and said alternating layers to expose at least said initial conductive layer;
    g) forming a conductive fin in said channel, to overlie said masking pattern, said fin capable of electrical communication with said initial and said alternate conductive layers, thereby said initial and alternate conductive layers and said fin capable of functioning as a first capacitor plate upon completion of the fabrication of the capacitor;
    h) exposing said alternate and said masking insulative layers;
    i) etching at least a portion of said alternate and masking insulative layers, said etching creating cavities and exposing vertical portions of said initial and alternate conductive layers and vertical portions of said fin;
    j) blanket depositing a dielectric layer to overlie at least said initial and alternate conductive layers and said fin; and
    k) blanket depositing a cell conductive layer to overlie said dielectric layer, said cell conductive layer capable of functioning as a second capacitor plate, said dielectric layer capable of electrically insulating said first and second capacitor plates one from the other.

2. The method as specified in claim 1, further comprising planarizing said interlayer prior to forming said opening.

3. The method as specified in claim 1, further comprising:
    a) masking said interlayer with a contact photoresist pattern prior to forming said opening, said masking defining a self-aligned region in which to form said opening in said interlayer; and
    b) removing said photoresist pattern subsequent to said step of forming said opening.

4. The method as specified in claim 3, wherein said forming further comprises reactive ion etching said interlayer according to said contact photoresist pattern.

5. The method as specified in claim 1, wherein said forming said conductive fin further comprises depositing a conductive material in said channel.

6. The method as specified in claim 1, wherein said extending said channel further comprises exposing said substrate.

7. The method as specified in claim 6, wherein said forming said conductive fin further comprises epitaxially growing said fin from said substrate.

8. The method as specified in claim 1, wherein said exposing further comprises etching at least said conductive fin.

9. The method as specified in claim 8, wherein said etching at least said conductive fin further comprises reactive ion etching said conductive fin.

10. The method as specified in claim 8, wherein said etching at least said conductive fin further comprises wet poly etching said conductive fin.

11. The method as specified in claim 1, wherein said exposing further comprises planarizing at least said conductive fin.

12. The method as specified in claim 11, wherein said planarizing further comprises chemical mechanical polishing.

13. The method as specified in claim 1, wherein said anisotropically etching said masking insulative layer and said alternating layers further comprises reactive ion etching.

14. The method as specified in claim 1, wherein said etching at least a portion of said alternate and masking insulative layers further comprises wet etching said alternate and masking insulative layers.

15. The method as specified in claim 1, wherein said etching at least a portion of said alternate and masking insulative layers further comprises vapor etching said alternate and masking insulative layers.

16. The method as specified in claim 1, further comprising performing a wet anneal subsequent to said depositing said dielectric layer.

17. The method as specified in claim 1, wherein said insitu etching further comprises alternating reactive ion etchants confined in a chamber, said alternating etchants initiated with an etchant specific to said masking insulative layer, followed by alternating etchants for said at least on alternate conductive layer and said at least on alternate insulative layer, said insitu etching terminated with an etchant for said alternate insulative layer.

18. A method for forming a plurality of capacitors in a semiconductor device comprising:
a) creating a dielectric interlayer to overlie previously fabricated semiconductor structures and contact areas of a substrate of the semiconductor device;
b) masking said interlayer with a contact photoresist pattern, said masking defining self-aligned regions in which to form said plurality of capacitors;
c) etching said interlayer in order to expose contact areas of said substrate and in order to form openings in said self-aligned regions of said interlayer;
d) removing said photoresist;
e) depositing an initial conductive layer in said openings to overlie said interlayer, said previously fabricated semiconductor structures and said contact area of said substrate;
f) alternately depositing alternating layers including depositing at least one alternate insulative layer and at least one alternate conductive layer to overlie said initial conductive layer, said alternate depositing initiated with an insulative layer and terminated with a final conductive layer;
g) forming masking patterns by depositing a masking insulative layer to overlie said final conductive layer, such that channels are retained in said openings, said channel defined by sidewalls, said sidewalls including said masking insulative layer, said sidewalls forming said masking patterns;
h) extending said channels in a direction toward said substrate by anisotropically insitu etching, according to said masking patterns, said masking insulative layer and said alternating layers to expose at least said initial conductive layer;
i) forming a conductive fin in each of said channels to overlie said masking pattern, said fins capable of electrical communication with said initial and said alternate conductive layers, thereby said initial and alternate conductive layers and said fins capable of functioning as first capacitor plates upon completion of the fabrication of the capacitors of said plurality;
j) exposing said alternate and said masking insulative layers;
k) etching at least a portion of said alternate and masking insulative layers, said etching creating cavities and exposing vertical portions of said initial and alternate conductive layers and said fins;
l) blanket depositing a dielectric layer to overlie the exposed portions of said initial and alternate conductive layers and said fins;
m) defining and isolating a horizontal areas of said first capacitor plates; and
n) depositing a cell conductive layer to overlie said dielectric layer, said cell conductive layer capable of functioning as second capacitor plates of said plurality of capacitors, said cell conductive layer providing electrical communication between said second capacitor plates of said plurality of capacitors, said dielectric layer capable of electrically insulating said first and second capacitor plates one from the other.

19. The method as specified in claim 18, wherein said exposing said alternate and masking insulative layers and said defining and isolating said horizontal area of said first capacitor plates further comprises planarizing said initial and alternate conductive layers and said alternate and masking insulative layers and said fins in order to expose said interlayer.

20. The method as specified in claim 18, wherein said defining and isolating said horizontal areas of said first capacitor plates further comprises:
a) depositing a cell plate layer prior to the depositing of a cell conductive layer;
b) depositing an oxidation resistant material to overlie said cell plate layer;
c) patterning said first capacitor plates with a first capacitor plate photoresist mask, in order to isolate each of said first capacitor plates one from the other;
d) etching said initial conductive layer, said dielectric layer, said oxidation resistant material, and said cell plate layer in order to expose ends of said initial conductive layer;
e) oxidizing said ends in order to insulate said initial conductive layer from said cell conductive layer during subsequent said deposition of said cell conductive layer, said cell conductive layer and said cell plate layer being in electrical communication subsequent to said deposition of said cell conductive layer, said cell plate layer and said cell conductive layer capable of functioning as a second capacitor plate of said plurality of capacitors; and f) removing said first capacitor plate photoresist mask and said oxidation resistant material in order to expose said cell plate layer, hence said cell plate layer ready to accept said cell conductive layer.

21. The method as specified in claim 18, wherein said defining and isolating said horizontal areas of said first capacitor plates further comprises:
   a) patterning said first capacitor plates with a photoresist mask;
   b) etching said initial conductive layer and said dielectric layer in order to expose ends of said initial conductive layer;
   c) oxidizing said ends in order to insulate said initial conductive layer from said cell conductive layer during subsequent said deposition of said cell conductive layer; and
   d) removing said photoresist mask to expose said dielectric layer, hence said dielectric layer ready to accept said cell conductive layer.

22. The method as specified in claim 18, wherein said extending said channels further comprises exposing said contact areas.

23. The method as specified in claim 22, wherein said forming said conductive fins comprises epitaxially growing said fins from said substrate.

24. The method as specified in claim 18, wherein said forming said conductive fins comprises depositing a conductive material in said channel.

25. The method as specified in claim 18, wherein said insitu etching further comprises alternating reactive ion etchants confined in a chamber, said alternating etchants initiated with an etchant specific to said masking insulative layer, followed by alternating etchants for said alternate conductive layers and said alternate insulative layers, said insitu etching terminated with an etchant for said alternate insulative layer.

26. The method as specified in claim 18, further comprising:
   a) patterning said cell conductive layer with a cell conductive layer photoresist pattern, said patterning allowing retention of said electrical communication between said plurality of capacitors while defining regions for further fabrications;
   b) etching said cell conductive layer in order to remove said cell conductive layer from regions reserved for further fabrications; and
   c) removing said cell conductive layer photoresist pattern.

27. A plurality of capacitors in a semiconductor device formed by a method comprising:
   a) creating a dielectric interlayer to overlie previously fabricated semiconductor structures and contact areas of a substrate of the semiconductor device;
   b) masking said interlayer with a contact photoresist pattern, said masking defining self-aligned regions in which to form said plurality of capacitors;
   c) etching said interlayer in order to expose contact areas of said substrate and in order to form openings in said self-aligned regions of said interlayer;
   d) removing said photoresist;
   e) depositing an initial conductive layer in said openings to overlie said interlayer, said previously fabricated semiconductor structures and said contact area of said substrate;
   f) alternately depositing alternating layers, said alternating layers including at least one alternate insulative layer and at least one alternate conductive layer to overlie said initial conductive layer, said alternate depositing initiated with an insulative layer and terminated with a final conductive layer;
   g) forming masking patterns by depositing a masking insulative layer to overlie said final conductive layer, such that channels are retained in said openings, said channel defined by sidewalls, said sidewalls including said masking insulative layer, said sidewalls forming said masking patterns;
   h) extending said channels in a direction toward said substrate by anisotropically insitu etching according to said masking pattern, said masking insulative layer and said alternating layers to expose at least said initial conductive layer;
   i) forming a conductive fin in each of said channels to fin overlie said masking pattern, said fins capable of electrical communication with said initial and said alternate conductive layers, thereby said initial and alternate conductive layers and said fins capable of functioning as first capacitor plates upon completion of the fabrication of the capacitors of said plurality;
   j) exposing said alternate and said masking insulative layers;
   k) etching at least a portion of said alternate and masking insulative layers, said etching creating cavities and exposing vertical portions of said initial and alternate conductive layers and said fins;
   l) blanket depositing a dielectric layer to overlie the exposed portions of said initial and alternate conductive layers and said fins;
   m) depositing a cell plate layer;
   n) depositing an oxidation resistant material to overlie said cell plate layer;
   o) patterning said first capacitor plates with a first capacitor plate photoresist mask in order to isolate each of said first capacitor plates one from the other;
   p) etching said initial conductive layer, said dielectric layer, said oxidation resistant material, and said cell plate layer in order to expose ends of said initial conductive layer;
   q) oxidizing said ends in order to insulate said initial conductive layer;
   r) removing said first capacitor plate photoresist mask and said oxidation resistant material in order to expose said cell plate layer; and
   s) depositing a cell conductive layer to overlie said cell plate layer, said cell conductive layer and said cell plate layer being in electrical communication, said cell plate layer and said cell conductive layer capable of functioning as second capacitor plates of said plurality of capacitors, said cell conductive layer providing electrical communication between said second capacitor plates of said plurality of capacitors, said dielectric layer capable of electrically insulating said first and second capacitor plates one from the other.

28. The plurality of capacitors as specified in claim 27, wherein said conductive fins are formed by depositing a conductive material in said channel.

29. The plurality of capacitors as specified in claim 28, wherein said conductive fins comprise polycrystalline silicon subjected to an insitu phosphorous diffusion doping.

30. The plurality of capacitors as specified in claim 27, wherein said insitu etching further comprises alternating reactive ion etchants confined in a chamber, said alternating etchants initiated with an etchant specific to said masking insulative layer, followed by alternating etchants for said alternate conductive layers and said alternate insulative layers, said insitu etching terminated with an etchant for said alternate insulative layer.

31. The plurality of capacitors as specified in claim 27, wherein said initial conductive layer comprises depositing a polycrystalline silicon layer subjected to an insitu phosphorous diffusion doping.

32. The plurality of capacitors as specified in claim 27, wherein said at least one alternate conductive layer further comprises a polycrystalline silicon layer subjected to an insitu phosphorous diffusion doping.

33. The plurality of capacitors as specified in claim 27, wherein said dielectric isolation interlayer comprises borophosphosilicate.

34. The plurality of capacitors as specified in claim 27, wherein said at least one alternate insulative layer and said masking insulative layer comprise oxide.

35. The plurality of capacitors as specified in claim 27, wherein said dielectric layer comprises silicon nitride.

36. A semiconductor capacitor comprising:
a) a first conductive bottom portion in contact with a contact area of a substrate;
b) first conductive sidewalls extending substantially vertical with respect to said substrate, said first sidewalls contiguous to said first bottom portion at a perimeter of said bottom portion, a first conductive layer including said first conductive bottom portion and said first conductive sidewalls;
c) a second conductive bottom portion smaller than, overlying, and substantially parallel to said first conductive bottom portion;
d) an insulative portion interposed between said first bottom portion and said second bottom portion thereby electrically isolating said first bottom portion and said second bottom portion one from the other;
e) second conductive sidewalls extending substantially vertical to said substrate, said second sidewalls contiguous to said second bottom portion at a perimeter of said second bottom portion, a second conductive layer including said second conductive bottom portion and said second conductive sidewalls;
f) a conductive fin substantially parallel to said first and second sidewalls, said fin intersecting said second bottom portion and contacting at least said first bottom portion, thereby providing electrical communication between said first conductive layer, said second conductive layer, and said conductive fin, a first capacitor plate of the capacitor including said conductive fin and said first and second conductive layers;
g) a contiguous cell conductive layer interposed between said first and second conductive sidewalls and interposed between said second conductive sidewalls and said conductive fin, a second capacitor plate of the capacitor including said cell conductive layer; and
h) a dielectric layer interposed between said first and said second capacitor plates, said dielectric layer electrically insulating said first and second capacitor plates one from the other.

37. The capacitor as specified in claim 36, further comprising a projecting conductive rim contiguous and substantially perpendicular to said first sidewall at an uppermost perimeter of said sidewall, an outer perimeter of said rim larger than the uppermost perimeter of said sidewall.

38. The capacitor as specified in claim 37, wherein said contiguous cell conductive layer overlies said rim.

39. The capacitor as specified in claim 36, further comprising an additional conductive layer, said additional conductive layer having an additional conductive bottom portion smaller than, overlying, and substantially parallel to a preceding bottom portion located below said additional portion, said preceding and additional bottom portions interposed with an additional insulative layer, said insulative layer electrically isolating said additional and said preceding bottom portions, and said additional conductive layer having additional conductive sidewalls extending substantially vertical to said substrate and contiguous to an outer perimeter of said additional bottom portion, said cell capacitor layer overlying said additional sidewalls, said conductive fin dissecting said addition bottom portion and in electrical communication with said additional conductive layer.

40. The capacitor as specified in claim 39, wherein said capacitor further comprises a plurality of said additional conductive layers.

41. The capacitor as specified in claim 40, wherein said additional conductive layers comprise polycrystalline silicon layers subjected to an insitu phosphorous diffusion doping.

42. The capacitor as specified in claim 36, wherein said first conductive bottom portion is formed in an opening formed according to a masking pattern providing for a self-aligned opening in previously fabricated semiconductor structures and exposing said contact area.

43. The capacitor as specified in claim 36, wherein said conductive fin, said first conductive layer, said second conductive layer, and said cell conductive layer comprise polycrystalline silicon subjected to an insitu phosphorous diffusion doping.

44. The capacitor as specified in claim 36, wherein said insulative portion and said additional insulative layer comprise oxide.

45. The capacitor as specified in claim 36, wherein said dielectric layer comprises silicon nitride.

46. The capacitor as specified in claim 36, wherein the capacitor is a portion of a semiconductor device containing a plurality of said capacitors, said plurality having a common conductive cell plate layer overlying and in electrical communication with said cell conductive layer and overlying and insulated from ends of said projecting conductive rim, said plurality of capacitors attaining electrical communication one with the other via said common conductive cell plate layer.

47. The capacitor as specified in claim 46, wherein said common conductive cell plate layer comprises a polycrystalline silicon layer subjected to an insitu phosphorous diffusion doping.

* * * * *

UNITED STATES PATENT AND TRADEMARK OFFICE
CERTIFICATE OF CORRECTION

PATENT NO. : 5,150,276
DATED : September 22, 1992
INVENTOR(S) : Fernando Gonzalez, et al It is certified that error appears in the above-indentified patent and that said Letters Patent is hereby corrected as shown below:

Column 3, line 24, delete "reative" and insert -- reactive --;

Column 4, line 10, delete "reative" and insert -- reactive --;

Column 11, line 39, delete "on" and insert -- one --;

Column 11, line 40, delete "on" and insert -- one --;

Column 16, line 25, delete "addition" and insert -- additional --;

Signed and Sealed this

Sixteenth Day of November, 1993

Attest:

Attesting Officer

BRUCE LEHMAN

Commissioner of Patents and Trademarks